(12) United States Patent
LeClaire et al.

(10) Patent No.: US 9,588,420 B2
(45) Date of Patent: *Mar. 7, 2017

(54) APPARATUS AND METHOD FOR INDIRECT SURFACE CLEANING

(71) Applicant: RAVE LLC, Delray Beach, FL (US)

(72) Inventors: Jeffrey E. LeClaire, Boca Raton, FL (US); Kenneth G. Roessler, Boca Raton, FL (US); David Brinkley, Baltimore, MD (US)

(73) Assignee: RAVE LLC, Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/048,774

(22) Filed: Feb. 19, 2016

(65) Prior Publication Data
US 2016/0170297 A1     Jun. 16, 2016

Related U.S. Application Data

(63) Continuation of application No. 14/656,206, filed on Mar. 12, 2015, now Pat. No. 9,285,674, which is a continuation-in-part of application No. 14/294,728, filed on Jun. 3, 2014, now Pat. No. 8,986,460, which is a continuation of application No. 14/077,028, filed on Nov. 11, 2013, now Pat. No. 8,741,067, which is a continuation of application No. 13/657,847, filed on Oct. 22, 2012, now Pat. No. 8,613,803, which is a continuation of application No. 12/277,106, filed on Nov. 24, 2008, now Pat. No. 8,293,019, which is a continuation of application No. 12/055,178, filed on Mar. 25, 2008, now Pat. No. 7,993,464.

(Continued)

(51) Int. Cl.
*G03F 1/82*     (2012.01)
*G03F 1/72*     (2012.01)
*B08B 7/00*     (2006.01)

(52) U.S. Cl.
CPC .............. *G03F 1/82* (2013.01); *B08B 7/0042* (2013.01); *G03F 1/72* (2013.01); *Y10S 134/902* (2013.01)

(58) Field of Classification Search
None
See application file for complete search history.

(56) References Cited

U.S. PATENT DOCUMENTS

2014/0363633  A1*  12/2014  Kim ......................... G03F 1/72
                                                                    428/195.1

FOREIGN PATENT DOCUMENTS

WO          02/27404 A2     4/2002
WO          WO 0227404 A2 *  4/2002  ............ B82Y 10/00

* cited by examiner

*Primary Examiner* — Nicole Blan
(74) *Attorney, Agent, or Firm* — Baker and Hostetler LLP

(57) ABSTRACT

A photomask includes at least one feature disposed thereon. The at least one feature has an associated design location, where a distance between a location of the at least one feature and the associated design location defines a positional error of the at least one feature. A method for improving a performance characteristic of the photomask includes directing electromagnetic radiation toward the photomask, the electromagnetic radiation having a wavelength that substantially coincides with a high absorption coefficient of the photomask; generating a thermal energy increase in the photomask through incidence of the electromagnetic radiation thereon; and decreasing the positional error as a result of the generating the thermal energy increase in the photomask.

15 Claims, 14 Drawing Sheets

Related U.S. Application Data

(60) Provisional application No. 60/954,989, filed on Aug. 9, 2007.

APPARATUS AND METHOD FOR INDIRECT SURFACE CLEANING

CROSS REFERENCE TO RELATED APPLICATIONS

This patent application is a continuation of U.S. patent application Ser. No. 14/656,206, filed on Mar. 12, 2015; which is a continuation-in-part of U.S. patent application Ser. No. 14/294,728, filed on Jun. 3, 2014, now U.S. Pat. No. 8,986,460; which is a continuation of U.S. patent application Ser. No. 14/077,028, filed on Nov. 11, 2013, now U.S. Pat. No. 8,741,067; which is a continuation of U.S. patent application Ser. No. 13/657,847, filed on Oct. 22, 2012, now U.S. Pat. No. 8,613,803; which is a continuation of U.S. patent application Ser. No. 12/277,106, filed on Nov. 24, 2008, now U.S. Pat. No. 8,293,019; which is a continuation of U.S. patent application Ser. No. 12/055,178, filed on Mar. 25, 2008, now U.S. Pat. No. 7,993,464; which claims priority to U.S. Provisional Patent Application No. 60/954,989, filed on Aug. 9, 2007, the entire disclosures of which are incorporated herein by reference.

TECHNICAL FIELD

This patent disclosure relates generally to devices and methods for cleaning surfaces and, more particularly, to devices and methods for cleaning surfaces of components used in the semiconductor industry, optical systems, and the like. The devices and methods disclosed herein are applicable to extending the useful life of photomask reticles, improving the performance of photomask reticles, or combinations thereof.

BACKGROUND

The photolithographic production of semiconductors utilizes a series of photomasks to produce the features on the semiconducting wafers. In each photolithographic step, a photomask is imaged onto the prepared semiconducting wafer. Once a photomask is imprinted onto the wafer, additional processing may be used to modify the semiconductor wafer material in the pattern of the photomask. In subsequent steps, additional photomasks may be imaged onto the wafer. High-precision alignment of the subsequent photomasks relative to features produced using the previous photomasks promotes the quality of structures manufactured on the semiconductor wafer. Metrics to evaluate the quality of structures manufactured on a semiconductor wafer may include dimensional precision of a single feature, dimensional precision of the location of a one feature relative to other features, or combinations thereof. Some dimensions of the features on the photomask may be referred to as critical dimensions (CDs), and the placement of features on the photomask relative to the other features may be referred to as overlay. For the most critical photomasks, the overlay requirement can be a few nanometers or less across the entire length of the mask.

The properties of photomasks, such as dimensional properties and material properties, for example, may vary within ranges resulting from tolerances applied during the manufacturing process. For example, the optical performance characteristics of partially absorbing films may depend on the material composition of the film and a thickness of the film. Further, the CDs and overlay of the mask may vary depending on the precision of the write tools, the etching processes, the number and type of cleaning processes, and the temperatures and stresses applied on the photomask during fabrication. Variability in the characteristics of the unprocessed photomasks (e.g., compositional and film stress differences), can also contribute to the final variances in CD and overlay by varying the response of the photomask to the manufacturing processes.

The mask-to-mask differences ultimately lead to variations in the product created using the photomasks. For this reason, limits or ranges of performance criteria are applied to distinguish defective photomasks from photomasks that are acceptable for production use. If a photomask performance is outside an acceptable limit the photomask is rejected and another mask is built.

In addition to fabrication variances, the performance characteristics of photomask can change due to use in production. During production use, the photomask may be exposed to intense radiation, including ultraviolet (UV) radiation, deep ultraviolet (DUV) radiation, or extreme ultraviolet (EUV) radiation. The radiation can cause photo-degradation of the photomask, particularly of the thin film. Also, photomasks may require cleaning after use in production for a period of time. These cleaning processes may alter the characteristics of the photomask, and there may be a limit to the number of times a mask can be re-cleaned and still meet specifications.

A process for reducing the mask-to-mask variability of one or more of the critical process characteristics of a photomask could potentially improve the overall production yield of a semiconductor fabrication process using photomasks. Firstly, correcting out-of-specification masks and making them viable for production use could help to avoid production delays and costs associated with fabrication of new photomasks to replace the out-of-specification photomasks. Secondly, reducing the variation in one or more performance characteristics may result in tolerance margin that can be used to expand the acceptable range of another characteristic. Thus, reducing the variability of any critical photomask characteristic may provide the benefit of reducing the variability in the printed features on the product wafers, which improves device yield and performance.

As an example, it would be advantageous to improve the overlay of a photomask to improve the precision of feature placement on the wafer, which could be used to correct out of specification masks, thereby improving mask yield. In addition, it would be advantageous to reduce the mask-to-mask variation in overlay for sets of masks that are printed on the same wafer. By improving the alignment of the features from multiple masks on the wafer, an otherwise defective increase in the variability of another critical parameter may become acceptable.

As the photomask industry moves toward multiple patterning, there is an increased requirement for overlay precision between critical mask layers. In multiple patterning, two or more masks are used in combination to create reduced feature sizes on the printed wafer. The reduced feature sizes may require both reduced errors in individual masks and reduced overlay errors between sets of masks. Therefore, it would be particularly advantageous to develop a process to improve overlay for photomasks used in multiple patterning.

It will be appreciated that this background description has been created by the inventors to aid the reader, and is not to be taken as an indication that any of the indicated problems were themselves known in the art.

SUMMARY

At least in consideration of the above discussion, it would be advantageous to develop processes that could improve the overlay of a photomask by processing before, during, or after the photomask manufacturing processes.

It would be additionally advantageous to develop processes that could improve the overlay of a photomask to recover the changes produced by use in production.

It would be additionally advantageous to develop a novel method and/or apparatus for modifying the overlay of a photomask that enhances usability, performance, lifetime or other aspect of use.

It would be additionally advantageous to develop a novel laser based method and/or apparatus for modifying the overlay of a photomask that enhances usability, performance, lifetime or other aspect of use with a reduced potential for surface damage.

It would be additionally advantageous to integrate methods and/or apparatuses for modifying the overlay of a photomask into the photomask fabrication, wafer fabrication, and/or repair processes.

It would be additionally advantageous to develop a method and/or apparatus to improve the overlay of a photomask by local or global thermal modification of the partially absorbing film on a photomask surface.

It would be additionally advantageous to develop a novel laser based method and/or apparatus for thermal modification of a photomask to improve overlay that also produces a thermal based removal of surface contamination and enhances usability, performance, lifetime, or other aspect of use with a reduced potential for surface damage.

The foregoing needs are met, to a great extent, by certain embodiments of the present invention. According to one embodiment of the present invention, a method for modifying one or more characteristics of a material to affect the materials optical properties and/or affect the performance or lifetime of a device that utilizes the target material is provided. In particular, a method to modify the overlay of a photomask is provided. The method may include irradiation of the substrate surface to create a thermal energy or heat build-up in the substrate and/or thin film(s). The resulting temperature increase in the partial absorbing film produces a thermally based material change that may include, but is not limited to, composition changes (e.g., dehydration, oxidation), surface changes (e.g., morphology, roughness), or material property changes (e.g., annealing, densification).

The method may include the use of electromagnetic radiation and in particular the use of laser radiation. The inventive method may include a reduced risk of thin film damage by utilizing relatively long pulse-widths or by heating the substrate and thin film, by irradiation, to a similar temperature. The method provides for improved photomask performance by localized modification and/or uniform or non-uniform global modification of the photomask overlay.

The method may have advantage for applications where the environment above the substrate is substantially or full enclosed. In these cases, the method may also include directing an electromagnetic energy source through a material disposed relative to the surface that is part of the substrates environmental enclosure. For example, the inventive method could be used to modify the overlay of a pellicalized photomask.

According to another embodiment of the present invention, an apparatus for laser material modification utilizing the above described method is provided. The apparatus may include metrology for inspection of the photomask overlay. These measurements may be advantageously performed before, during or after application of the process and could be used for closed-loop control of the process during use.

The above mentioned apparatus may also include means of monitoring and controlling the temperature of the substrate and/or adjacent materials. Said means may include local temperature control or temperature control over the entire substrate.

According to yet another embodiment of the present invention, a photomask fabrication process that utilizes the method and/or apparatus disclosed herein is provided to modify the overlay of the photomask.

Certain embodiments of the present invention provide the ability to modify a material without surface preparation or environmental control above the substrate surface. Certain embodiments provide material modification with reduced risk of substrate damage. Further, certain embodiments of the present invention provide for an extended lifetime of photomasks used in wafer printing. Certain embodiments of the present invention also provide for increased precision in the manufacture of photomask used in wafer printing. In addition, certain embodiments of the present invention provide for reduced wafer manufacturing costs including improved photomask yield and performance leading to improved device yield.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Aspects of the disclosure will now be described in detail with reference to the drawings, wherein like reference numbers refer to like elements throughout, unless specified otherwise.

Figure 1A:
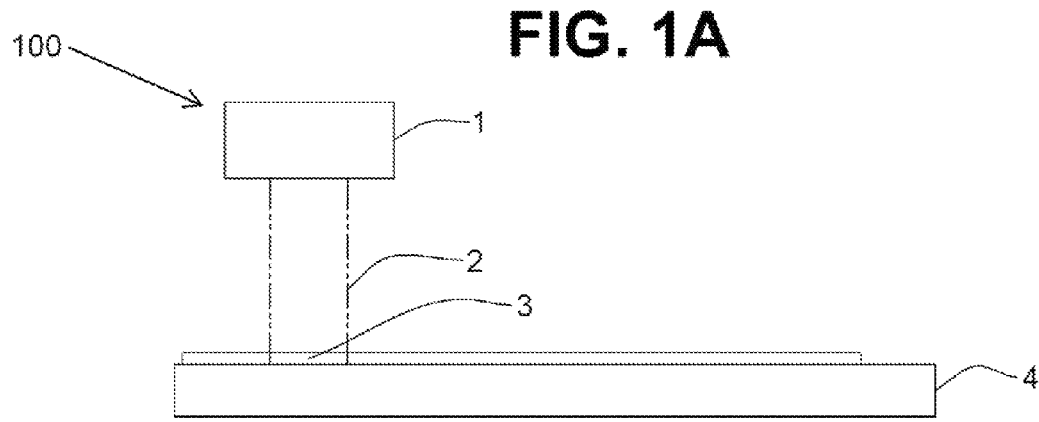
FIG. 1a illustrates a schematic diagram of externally-generated thermal excitation of a partially absorbing material.

Aspects of the disclosure provide an apparatus and a method for modifying the position of features on a photomask. FIG. 1a illustrates a schematic diagram of externally-generated thermal excitation of a partially absorbing material. As illustrated in FIG. 1a, the excitation apparatus 100 includes an external energy source 1 configured and arranged to direct an energy beam 2 onto a thin absorbing film 3 disposed on the surface of a partially or completely transmitting substrate 4. An excitation method, according to an aspect of the disclosure, may include direct excitation of the thin absorbing film 3 upon the substrate 4 by the energy beam 2 generated by the external energy source 1. The substrate 4 may be a photomask or compose at least a portion of a photomask assembly, and the terms "substrate" and "photomask" may be used interchangeably throughout the disclosure, unless specified otherwise.

Partially absorbing films, as described herein unless specified otherwise, are built specifically to allow at least a fraction of the lithographic light wavelength to pass through the film to enhance the printing effects on the wafer. Thus, partially absorbing films may not include opaque films.

According to an aspect of the disclosure, the external energy source 1 is an electromagnetic energy source and the energy beam 2 is an electromagnetic beam. According to another aspect of the disclosure, the external energy source 1 is a light source, and the energy beam 2 is a beam of light. According to another aspect of the disclosure, the external energy source 1 is a laser light source, and the energy beam 2 is a beam of laser light. However, it will be appreciated that the external energy source 1 may produce an energy beam 2 embodying other forms of energy, including but not limited to, an electron beam, a microwave beam, an x-ray beam, an acoustic wave, combinations thereof, or any other energy beam known in the art.

Interaction of the energy beam 2 with the thin absorbing film 3 or the substrate 4 may cause thermal excitation of the thin absorbing film 3, the substrate 4, or combinations thereof. According to an aspect of the disclosure, interaction of the energy beam 2 with the thin absorbing film 3 results in an increase in thermal energy of a material of the thin absorbing film 3, which may cause an increase in the temperature of the material of the thin absorbing film 3. Alternatively or additionally, interaction of the energy beam 2 with the substrate 4 results in an increase in thermal energy of a material of the substrate 4, which may cause an increase in the temperature of the material of the substrate 4. In turn, when a temperature of the substrate 4 is greater than a temperature of the thin absorbing film 3, heat may transfer from the substrate 4 to the thin absorbing film 3 by conduction, convection, radiation, or combinations thereof, thereby further increasing the thermal energy or temperature of the thin absorbing film 3.

It will be appreciated that a thermal energy increase in a material, as described herein, may refer to an increase in enthalpy (h), an increase in internal energy (u), an increase in temperature, or combinations thereof.

Figure 1B:
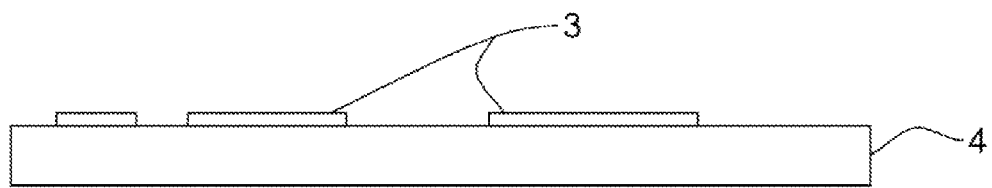
FIG. 1b illustrates a side view of a thin absorbing film on top of a substrate.

FIG. 1b illustrates a side view of a thin absorbing film 3 on top of a substrate 4. In FIG. 1b, the thin absorbing film 3 is patterned, such that some portions of the substrate 4 are in communication with the external energy source 1 via the thin absorbing film 3 disposed thereon, while other portions of the substrate are in direct communication with the external energy source 1 without prior transmission of the energy beam 2 through the thin absorbing film 3. Accordingly, it will be appreciated that heat generated in portions of the substrate 4 in direct communication with the external energy source 1 may conduct through the substrate 4 before transfer into the thin absorbing film 3 via conduction, convection, radiation, or combinations thereof.

According to an aspect of the disclosure, a method for modifying one or more characteristics of a material to affect the material properties and/or affect the performance or lifetime of a device that utilizes the target material is provided. In a non-limiting example, a method for modifying the position of features on a substrate is provided. In the case of a thin absorbing film 3 on a photomask 4, the method may increase the useable lifetime of the photomask 4 by moving the position of features in the thin absorbing film 3 that have been shifted by production use, cleaning processes, or external forces applied to the photomask (e.g., attachment of a pellicle to the photomask 4). The method may include excitation of the substrate surface to create a uniform increase in thermal energy or temperature rise in the substrate 4 and thin absorbing film 3. The resulting temperature increase in the substrate 4 and/or thin film 3 produces a thermally-based material change that may include, but is not limited to, composition changes (e.g., dehydration, oxidation), surface changes (e.g., morphology, roughness), or material property changes (e.g., annealing, densification). Alternatively or additionally, the result of the thermally-based material change can be a change to an optical performance characteristic of the photomask.

External energy sources 1, other than lasers, may be used. For example, the external energy source 1 may include lamps or other devices that can radiate energy along any portion of the electromagnetic spectrum, including microwaves, infrared radiation, near-ultraviolet radiation, deep ultraviolet radiation, extreme ultraviolet radiation, electron beam generators, x-ray generators, or combinations thereof.

The thin absorbing film 3 and the substrate 4 may be fabricated from or include many different materials. According to an aspect of the disclosure, the substrate 4 could have thin film absorber properties and may be targeted for material modification without a thin absorbing film 3 disposed thereon. A temperature increase in the thin absorbing film 3 may produce a thermally-based change in a material of the thin absorbing film 3, and/or a property of the thin absorbing film 3, including, but not limited to, dehydration, oxidation, surface roughness, annealing, or combinations thereof.

According to aspects of the disclosure, a threshold temperature to modify the thin absorbing film 3 is below a temperature that could cause damage to a material of the substrate 4, thereby mitigating risk of thermally-based damage to the substrate 4. Aspects of the disclosure may also reduce the risk of substrate 4 damage relative to other substrate or film modification techniques because it can, in some instances, utilize relatively long pulse-widths which may reduce the potential for multi-photon absorption processes. According to an aspect of the disclosure a pulse-width of the energy beam 2 may range from 1 microsecond to 10 milliseconds. According to another aspect of the disclosure the laser pulse-width may be greater than 1 microsecond up to and including continuous wave laser excitation.

Figure 4:
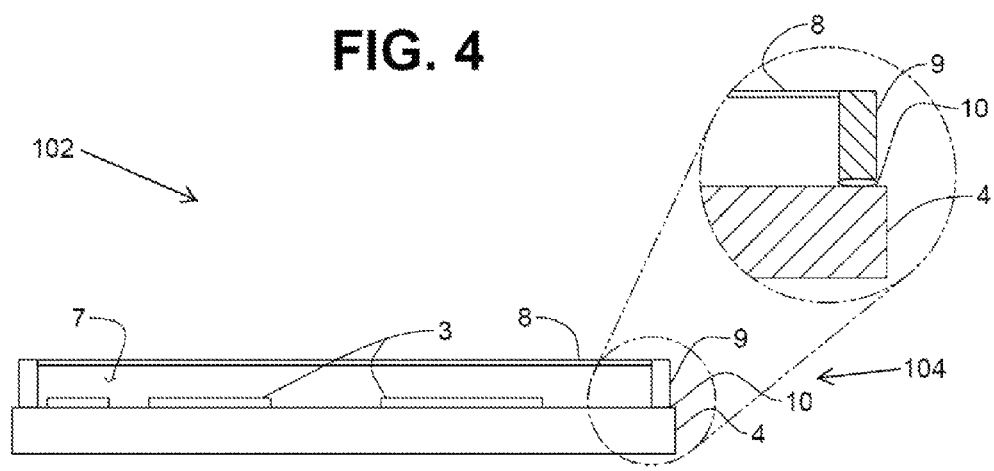
FIG. 4 illustrates a diagram of a photomask surface with thin film partial absorber including a pellicle attached thereto.

Apparatus and methods of the present disclosure may be advantageous for applications where the environment above the thin film absorber 3 is substantially or fully enclosed. For example, FIG. 4 illustrates a photomask assembly 102 including a thin absorbing film 3 and a pellicle 8 attached to the thin absorbing film 3. When the thin absorbing film 3 is enclosed, the method may also include directing the energy beam 2 through a material disposed proximate to the outer surface of a pellicle 104 that is part of the substrate's environmental enclosure. For example, apparatus and methods according to the present disclosure may be used to modify the overlay of a pellicalized photomask (see FIG. 5a), where the pellicle 104 includes a pellicle film 8, a pellicle frame 9, and a pellicle frame adhesive 10.

According to aspects of the present disclosure, the method includes selecting a laser wavelength that substantially coincides with a strong absorption of a thin absorbing film 3 and setting the laser energy and pulse width to produce the desired thin absorbing film 3 modification. Increased absorption in the substrate 4, in some instances, allows lower laser energies to be used for the process and, therefore, may decrease the potential for damage to adjacent materials that may interact with the laser beam 2 as it is incident upon or reflected from the surface of the substrate 4.

According to other aspects of the present disclosure, an energy beam 2 wavelength that is highly absorbed by the substrate 4 is selected, which may be beneficial when the majority of the substrate has the thin film absorber removed. Further, selecting a wavelength of the energy beam 2 close to a strong absorption band of the substrate 4 may also reduce thermal or temperature differences between the thin film absorber 3 and the substrate 4, thereby decreasing differential thermal expansion between the thin absorbing film 3 and the substrate 4. The use of multiple laser beam wavelengths and/or laser beam energies may be used if multiple thin film absorbers or a substrate that consists of more than one material are used. Multiple wavelengths may be produced, for example, by utilizing multiple laser sources or a single tunable laser source, or both. Multiple energies can be used by control of the output energy of each laser source using controls and/or devices internal or external to each laser source.

A substrate consisting of multiple materials may require consideration of the material parameters as well as the energy beam 2 parameters, including excitation wavelength selection. According to an aspect of the disclosure, a laser wavelength having significant absorption in the thin film absorber 3 material is selected. In some embodiments the selected wavelength will have a small absorption in or be highly reflected by other materials on or in the substrate 4 such that the thermal energy increase will be primarily in the thin film absorber 3 material. This may be particularly useful if material adjacent to the thin film absorber will be affected by the process temperature. For example, in the case of a pellicalized photomask, the pellicle film 8 and pellicle frame adhesive 10 may be in close proximity to the thin film absorber film. Reducing the overall thermal energy or temperature build up in the system may be important if, for example, if the pellicle frame adhesive outgases or degrades. Minimizing the total thermal energy or temperature buildup may also be important if significant heat is transferred to the environment 7 between the photomask 4 surface and the pellicle film 8 because this thermal build up could affect the film 8, the adhesive 10, the pellicle frame 9 materials, or combinations thereof. In some cases, the process temperature may be preferentially maintained below the damage or modification temperatures of the substrate 4 material.

In other embodiments, the basis of the material modification process may make it particularly desirable for all areas of a substrate 4 to reach a temperature substantially near that typically needed for modification without exceeding the thermal damage threshold of the substrate 4 or other adjacent materials. It is possible that the laser energy required to bring one of the materials to the material modification process temperature will produce thermal damage in the other material, particularly if there is a significant difference between the material absorptions. The local fluence of the energy beam 2 may be controlled based on the materials being exposed.

In other embodiments, the basis of the material modification process may make it particularly desirable for different areas of a substrate 4 to reach different temperatures and levels of processing. Indeed, the rate and extent of material modification may be dependent on the laser energy. In this case, the local fluence of the beam may be controlled based on the desired amount of material change in the different areas of the substrate 4. It is also possible that the material modification may depend on the number of times the energy source is applied to the substrate 4. In this case, the number of applications of the energy source may be varied across the substrate to produce different amounts of material modification at different areas of the substrate 4.

According to aspects of the disclosure, longer laser pulse widths, up to and including continuous wavelength (CW) lasers, are used to improve the thermal equilibrium between materials with significantly different absorption constants. However, the use of such longer laser pulse widths produce the highest thermal energy or temperature increase in the overall system and may not be useable if a material adjacent to the substrate surface has a thermal damage threshold or other adverse thermally induced affect below the process temperature.

According to aspects of the disclosure, a laser wavelength that has a significant absorption in several or all of the materials on the substrate 4 is selected. The same laser energy may then, for example, be used to produce the desired process temperature below any of the substrate materials' damage thresholds. By considering the thermal properties (including diffusivity) it is also possible to take advantage of the thermal energy or heat transfer between the different materials. This, in some cases, allows the use of a reduced process fluence to achieve the desired thermal modification in the substrate 4 and/or thin film absorber 3, particularly if the thermal energy or heat flow from a higher absorbing material is preferential to the lower absorbing material. In this case, the heat flow from the higher absorbing material to the lower absorbing material may increase the temperature of the lower absorbing material using a lower process energy than may be required by direct exposure of the lower absorbing material by the energy source.

Practical Example

The following is an example of a method according to one aspect of the present disclosure applied to modifying the overlay of a photomask substrate that is used in wafer fabrication processes. In this example, thermal treatment according to aspects of the disclosure can modify the substrate and/or thin film of a photomask to cause shifts in the positions of the features in the thin film relative to other features on the mask. This example may be used throughout the several aspects disclosed herein.

Control of the laser beam parameters may be particularly desirable in the aspects related to overlay adjustment of a photomask. Wavelength selection, for example, is highly desirable because of the physical structure of the typical photomask. In some cases, a photomask assembly 102 includes a quartz substrate 4 with a thin film absorber 3 or partially absorbing film 3 on the critical surface of the substrate 4 (see FIGS. 1a and 1b). In the case of the thin absorbing film 3 being a metal film, there will typically be a significant absorption coefficient for the majority of producible laser wavelengths. However, in the case of partially absorbing films there may be wavelength regions where these films do not significantly absorb, unlike pure metal films. For the quartz substrate 4, however, there may be a limited wavelength range where the substrate has significant absorption and laser sources are commonly available. Therefore, certain embodiments may utilize a wavelength that is highly absorbed by the thin film while the substrate is weakly absorbing or transparent to the selected wavelength. This process may minimize the overall temperature increase of the system and may reduce the risk of direct absorption damage of the quartz substrate.

Figure 14:
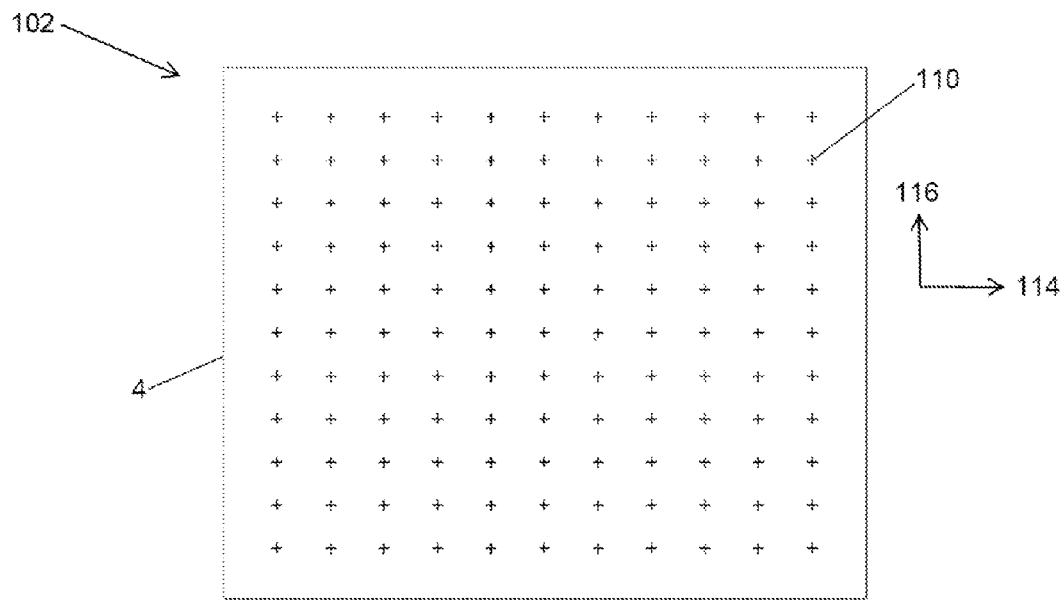
FIG. 14 illustrates a plan view of a photomask assembly, according to an aspect of the disclosure.

According to aspects of the disclosure, it may be advantageous to move the features of a photomask assembly 102 to reduce an error in overlay due to the mask fabrication and utilization processes. FIG. 14 illustrates a plan view of a photomask assembly marked with an intended or design feature array 110 on the surface of the photomask 4. The design feature array 110 illustrated in FIG. 14 is schematically shown as an array of cross (+) features; however, it will be appreciated that the cross features so illustrated are merely representative of points on any photomask features known in the art. Typically, the design feature array 110 is generated by patterning the thin film 3 on the photomask substrate 4. However, patterns could be made directly into the substrate surface without or without the presence of a thin film on the surface.

In one example, the majority of the photomask is covered with a thin film absorber 3, which may be a so-called "dark field mask," and the individual features of the design feature array 110 are generated by removing the thin film only at the design feature locations. In another example, the majority of the photomask has the thin film absorber removed, which may be a so-called "clear field mask," and the individual features of the design feature array 110 are generated by leaving the thin film only at the design feature locations. In either dark field or clear field photomasks, the actual position of the features may vary from the designed pattern array, for example, as a result of variance in the manufacturing process or feature migration resulting from photomask use in a semiconductor fabrication process.

Figure 15:
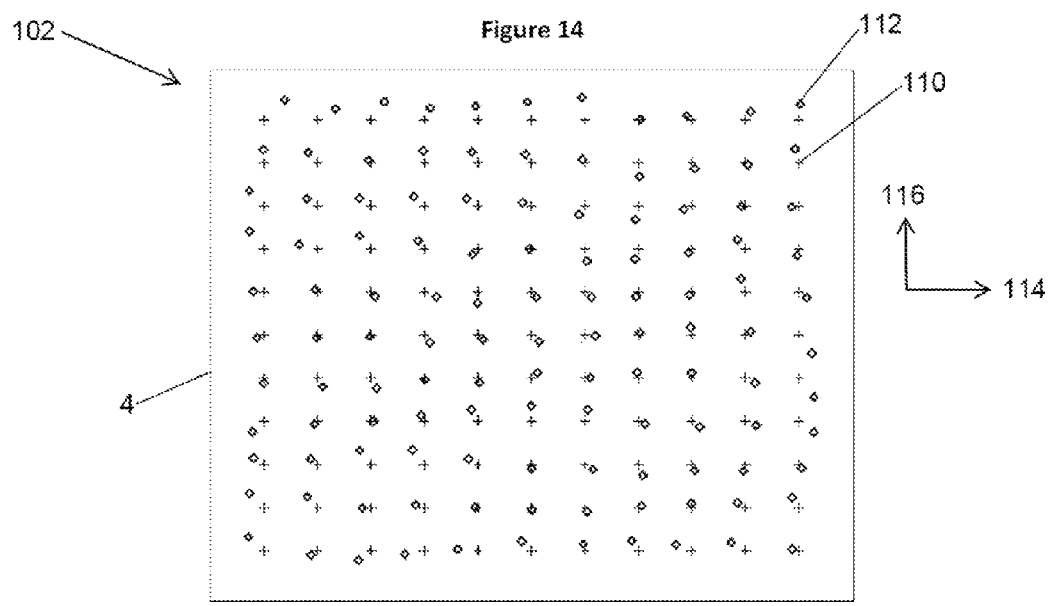
FIG. 15 illustrates a plan view of a photomask assembly, according to an aspect of the disclosure.

FIG. 15 illustrates a plan view of a photomask assembly 102, according to an aspect of the disclosure. Similar to FIG. 14, FIG. 15 includes a design array of features 110 marked with cross symbols, but in addition, FIG. 15 includes an actual array of features 112 marked by diamond (◊) symbols. Each actual feature in the actual array of features 112 may correspond to a design feature in the design array of features 110. A difference between the actual position of a feature from the actual feature array 112 and design or intended position for a corresponding design feature in the design feature array 110 may define an error in the overlay. Depending on the source(s) of the error, the position of the actual pattern relative to intended pattern may be systematic and/or random.

The error in the overlay may have a component in a first direction 114, a component in a second direction 116, or combinations thereof. Further, a total position error over all actual features in the actual feature array 112 may be defined according to a statistical measure over all actual features in the actual feature array 112, including but not limited to, a sum of errors, a square root of a sum of squares of the errors, or any other statistical measure of error known in the art.

The dimensions of the process, the energy of the laser and the number of times each location is exposed will vary depending on the response of the photomask to the process. For example, the response to applying the disclosed process to the entire photomask substrate 4, at a constant fluence, may be a contracting radial pattern as shown in FIG. 16.

Figure 16:
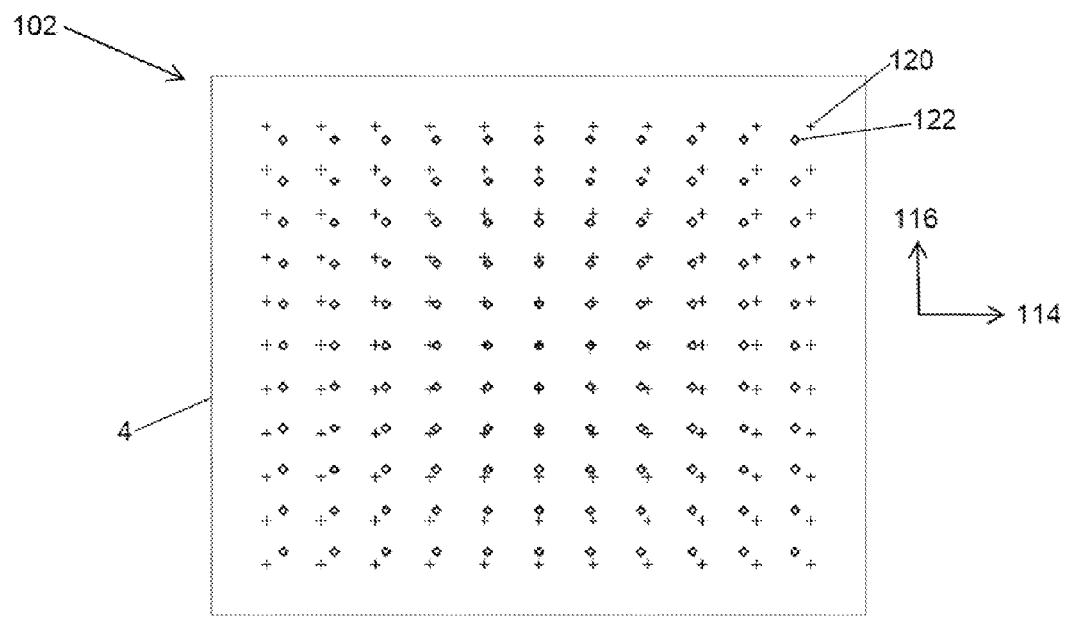
FIG. 16 illustrates a plan view of a photomask assembly, according to an aspect of the disclosure.

FIG. 16 illustrates a plan view of a photomask assembly 102, according to an aspect of the disclosure. In FIG. 16, the cross (+) symbols represent an actual feature array 120 before treatment of the substrate 4 using the external energy source 1, and the diamond (◇) symbols represent an actual feature array 122 after treatment of the substrate 4 using the external energy source 1, according to aspects of the disclosure. The radial contraction of the pattern toward the center of the photomask can be seen in FIG. 16. This illustration is only one possible result of applying the disclosed method to the entire photomask substrate 4 and is used for illustrative purposes only. Alternatively, the process could result in an expanding radial distribution or a fixed lateral movement at each location, or other relative motion.

Figure 17:
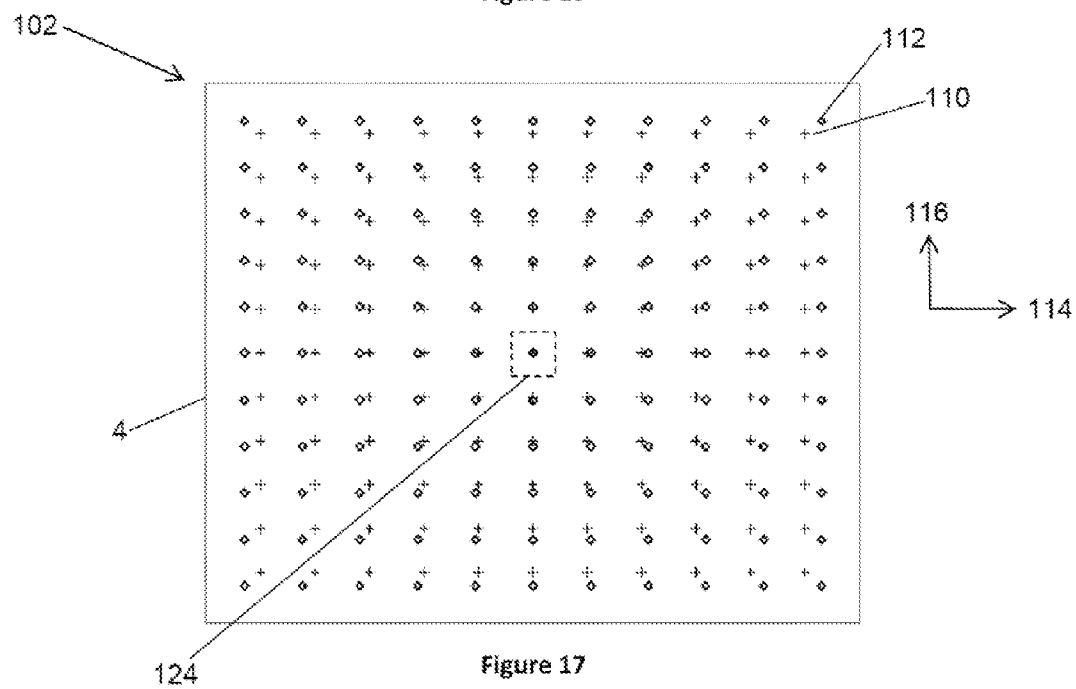
FIG. 17 illustrates a plan view of a photomask assembly, according to an aspect of the disclosure.

FIG. 17 illustrates a plan view of a photomask assembly 102, according to an aspect of the disclosure. In FIG. 17, the cross (+) symbols represent a design feature array 110, and the diamond (◇) symbols represent an actual feature array 112. The overlay error between the design feature array 110 and the actual feature array 112 is a radially expanding pattern from the center of the photomask 4. It will be appreciated that treating the photomask 4 with an energy beam 2 from the external energy source 1, according to aspects of the disclosure, may contract the actual feature array 112 radially toward a center 124 of the photomask 4. The result is shown in FIG. 18.

Figure 18:
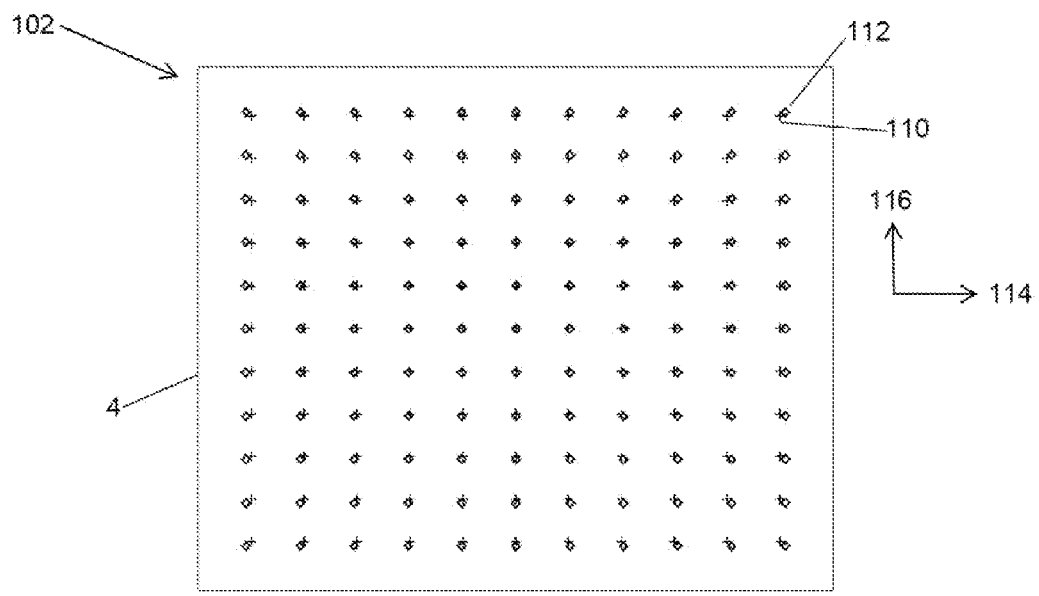
FIG. 18 illustrates a plan view of a photomask assembly, according to an aspect of the disclosure.

FIG. 18 illustrates a plan view of a photomask assembly 102, according to an aspect of the disclosure. In FIG. 18, the cross (+) symbols represent a design feature array 110, and the diamond (◇) symbols represent an actual feature array 112. As shown in FIG. 18, application of the energy beam 2 onto the photomask substrate 4, according to aspects of the disclosure, moves the actual feature array 112 closer to the design feature array 110, thereby reducing the overlay error of the photomask assembly 102.

Figure 19:
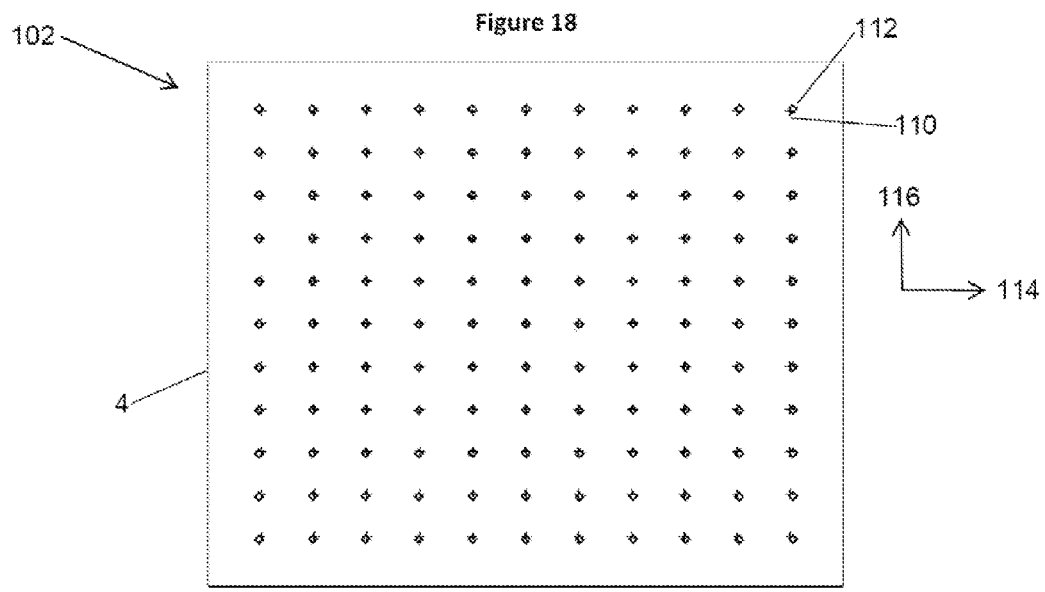
FIG. 19 illustrates a plan view of a photomask assembly, according to an aspect of the disclosure.

Continuing to apply the energy beam 2 to the substrate 4 can have a cumulative effect on locations of actual features in the actual feature array 112. FIG. 19 shows a plan view of a photomask assembly 102, according to an aspect of the disclosure. In FIG. 19, the cross (+) symbols represent a design feature array 110, and the diamond (◇) symbols represent an actual feature array 112 after additional treatment of the photomask assembly 102 in FIG. 18 with an energy beam 2, according to aspects of the disclosure. Thus, application of the process multiple times could move the actual feature array 112 even closer to the design feature array 110, thereby further reducing the overlay error of the photomask assembly 102, as shown in FIG. 19.

The dimensions of the process area, the energy of the laser, and the number of times each location is exposed may vary depending on initial overlay error of the photomask 4. For example, the overlay error may only occur over a portion of the photomask 4, as illustrated in FIG. 20.

Figure 20:
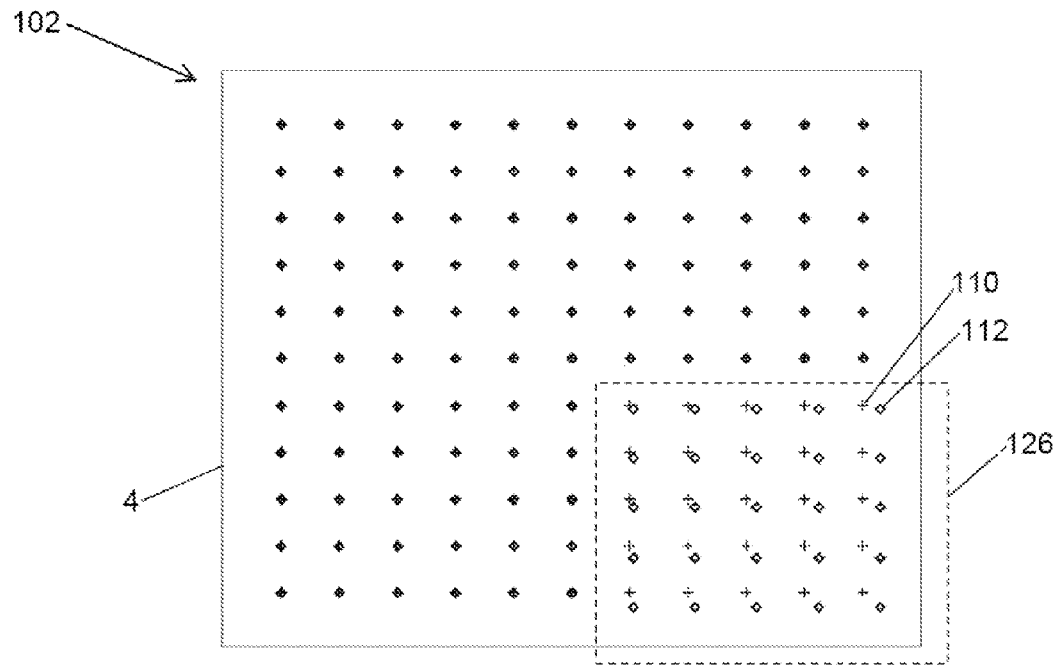
FIG. 20 illustrates a plan view of a photomask assembly, according to an aspect of the disclosure.

FIG. 20 illustrates a plan view of a photomask assembly 102, according to an aspect of the disclosure. In FIG. 20, the cross (+) symbols represent a design feature array 110, and the diamond (◇) symbols represent an actual feature array 112. As shown in FIG. 20, only the lower right portion 126 of the photomask 4 shows significant overlay error. In this case, treating only the lower right portion 126, or the error affected area, of the photomask 4 with the energy beam 2, according to aspects of the disclosure, may be advantageous to reduce the overlay error in of the lower right portion 126 the photomask 4, without treating the entirety of the photomask 4 with the energy beam 2.

Figure 21:
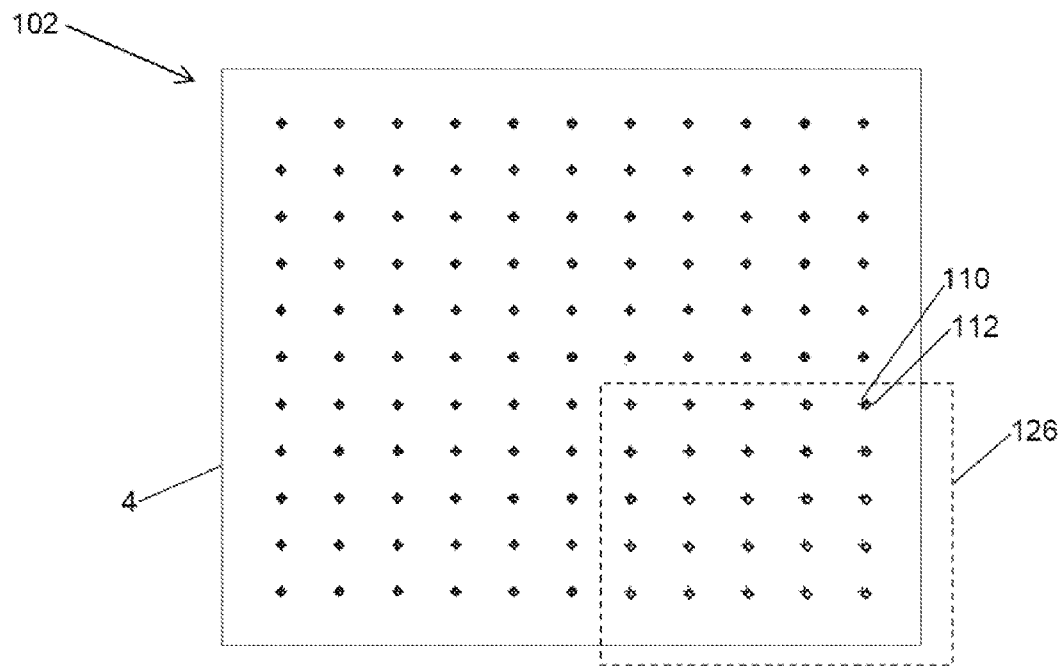
FIG. 21 illustrates a plan view of a photomask assembly, according to an aspect of the disclosure.

FIG. 21 illustrates a plan view of a photomask assembly 102, according to an aspect of the disclosure. In FIG. 21, the cross (+) symbols represent a design feature array 110, and the diamond (◇) symbols represent the actual feature array 112 from FIG. 20 after treatment of the photomask 4 using the energy beam 2, according to aspects of the disclosure. As shown in FIG. 21, treatment of the lower right portion 126 of the photomask 4 reduced the overlay error in the lower right portion 126 of the photomask 4.

If the overlay error is more random, as shown in FIG. 15, then it may be advantageous to vary the local energy and the number of applications of the energy beam 2 onto the photomask 4, according to aspects of the disclosure, uniquely to discreet areas of the mask. For such localized treatment of a photomask, an area of the process (size of the energy beam 2) may be advantageously adjusted to a small value relative to the distances between individual adjacent features in the actual feature array 112, so that the effect of the process has a resolution less than the distance between individual adjacent features in the actual feature array 112. For this embodiment, the energy and number of pulses may vary for each location on the mask so that features further away from the intended or design position can be moved a greater amount than features that are initially closer to the intended or design position.

Figure 9A:
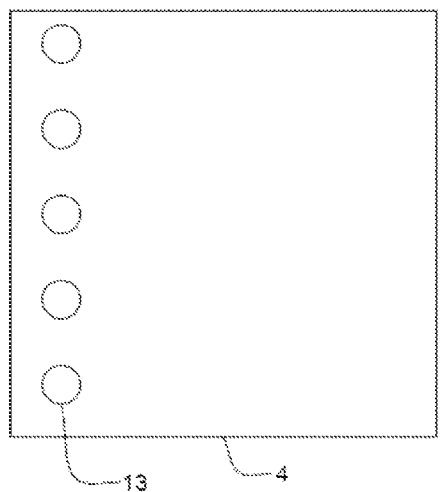
FIG. 9a illustrates a schematic diagram of a single pass of the laser beam across a surface to minimize local thermal energy or heat buildup. A single row or column with large lateral spacing between spots is illustrated.

In addition, the average material change could be controlled by processing multiple separated areas on the substrate surface (FIG. 9*a*), if there is a relatively fixed material change produced. In this case, the spacing between the process areas 13 and/or density of process areas relative to unprocessed area could be used to control the relative amount of the material change process.

A specific example of a representative method is the changing of one or more properties of a thin absorbing film 3 on a photomask substrate 4 with laser excitation to shift the features of the thin absorbing film 3. For example, in a photomask 4 where the thin absorbing film 3 is a Molybdenum Silicon Oxynitride ($Mo_wSi_xO_yN_z$) film, which may be abbreviated as MoSi, a shift in the overlay may result from a thermal material property change in the MoSi film. The material change may include, but is not limited to, oxidation, annealing, dehydrating, or densification of the thin film absorber 3 material. Considering the thermal damage levels of the photomask, the lowest thermal damage point will typically be the melting/reflow point for the base quartz substrate, i.e., around 2912 degrees Fahrenheit (1600 degrees Celsius). Depending on the exact material characteristics of the MoSi film, material changes (e.g., annealing) may occur at temperatures well below the reflow point of the quartz substrate 4. Therefore, there is a potential process where the temperature for material change can occur below the damage level of the photomask substrate materials.

Figure 2:
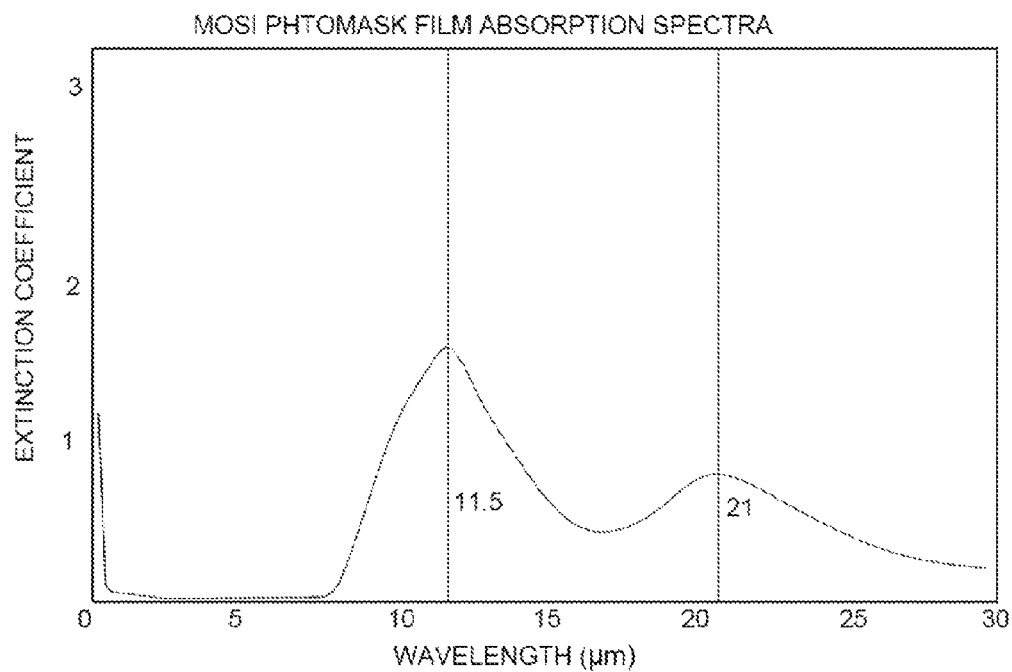
FIG. 2 illustrates a plot of a MoSi absorption spectrum from the deep ultraviolet to the far infrared region of the electromagnetic spectrum.

As discussed above, the relative absorption of the substrate materials is generally considered because of potential differences in the material absorption characteristics. It may be desirable to select a wavelength that is highly absorbed by the MoSi film. FIG. 2 is schematic diagram of an absorption curve for a MoSi partial absorbing photomask film. In this example, the main absorption occurs either below 0.3 μm wavelength or above 9 μm wavelength. The shorter wavelengths are not in a particularly desirable wavelength range, because they are usually significantly absorbed by air and because they have a higher photon energy and are therefore more likely to produce multiphoton processes.

Selecting wavelengths in the infrared region, from 1 um to 1000 um, may be preferred over DUV because the longer wavelength reduces the potential for multi-photon processes and environmental absorption. For a MoSi film, selecting a wavelength above 9 μm, for example near the 11.5 μm absorption peak, is particularly desirable according to aspects of the disclosure, which typically produces a high absorption in the MoSi film without high environmental absorption. According to an aspect of the disclosure, "near the 11.5 um absorption peak," means a wavelength in the range of 10.5 um to 12.5 um, although other wavelengths in the infrared region may be acceptable. Choosing a wavelength in this region could minimize the total thermal energy or heat input to the system during use of the current invention by lowering the energy required to produce the material change.

Figure 3:
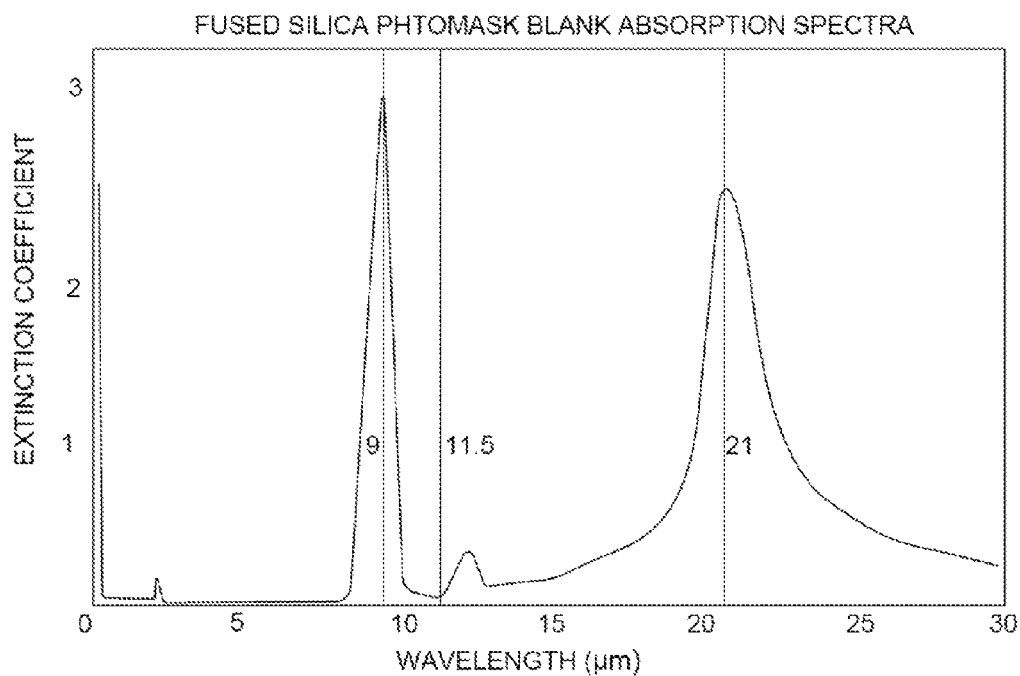
FIG. 3 illustrates a plot of a quartz absorption spectrum from the deep ultraviolet to the far infrared region of the electromagnetic spectrum.

Also as discussed above, consideration of the absorption of the quartz substrate may also be considered. Quartz substrates used for photomasks may be specifically designed to have high transmission in the deep ultraviolet (DUV) wavelength range (see FIG. 3). This is typically accomplished by using synthetically fused silica substrates that have extremely low level of impurities. According to aspects of the present disclosure, it may be an advantage to have a significant absorption in the MoSi and a lower absorption in the quartz substrate. As shown in FIG. 3, the absorption for the example quartz substrate does not have a significant absorption near the MoSi film absorption peak of 11.5 um. Therefore, processing at a wavelength near 11.5 um, it is possible that thermal energy build up in the MoSi would occur preferentially to the quartz, which could minimize the total thermal input to the system during use of the current invention by minimizing the thermal build up in areas of the substrate without thin film absorber 3.

Alternatively, it may be advantageous to select a wavelength that is highly absorbed by the quartz substrate of the photomask 4 such that the all areas of the photomask 4 surface reach the desired process temperature. Considering the thermal properties of the quartz versus the thin film absorber layer, it may be expected that thermal transfer between the materials will occur preferentially from quartz to the absorber layer. This may occur because quartz has a relatively low thermal diffusivity and the thin film absorber films typically contain a metal component and therefore have a higher thermal diffusivity. This embodiment may be advantageous if the temperature differential between the thin film absorber and the photomask substrate is important. For example, it is possible that a differential thermal expansion between the thin absorbing film 3 and the substrate 4 could lead to damage of one or both of the materials. It is also possible that having differing material expansions can weaken the bonding between the thin film absorber 3 and the substrate 4 and cause separation or delamination. If thermal equilibrium is beneficial between the thin film absorber and substrate, use of longer pulse widths may also be advantageous to allow sufficient time for heat transfer (e.g., heat conduction) between the materials as the process temperature is achieved.

Operating at a process wavelength where the quartz has a significant absorption at the process wavelength may be advantageous because the thermal energy flow or heat transfer will be preferential to the thin absorbing film 3 and the entire exposed area can reach the desired process temperature. The main absorption for these substrates generally occurs either below 0.2 μm wavelength or above 8 μm wavelength. The shorter wavelengths may not be particularly desirable because they may be significantly absorbed by air and because they have higher photon energy and are therefore more likely to produce multiphoton processes. As described above, wavelengths in the infrared region, from about 1 um to about 1000 um, may be preferred over DUV because the longer wavelength reduces the potential for multi-photon processes and environmental absorption.

Selecting a wavelength above 8 μm, for example near the 9 μm quartz absorption, may be particularly desirable according to aspects of the disclosure, which may produce a high absorption in the quartz substrate without high environmental absorption. According to an aspect of the disclosure, "near the 9 um absorption peak," means a wavelength in the range of 8 um to 10 um, although other wavelengths in the infrared region may be acceptable. This wavelength may also provide an advantage for photomasks that have a partially absorbing film coating (i.e., MoSi). As shown in FIG. 2, the example MoSi material has a reduced absorption near 9 um, compared to the peak at 11.5 um, and would therefore have a reduced thermal energy or temperature increase produced directly by the energy beam 2 from the external energy source 1. Generally, the film material temperature reached at constant energy beam 2 fluence using wavelengths in this range, should be similar to that for quartz because of the high quartz absorption and the higher thermal diffusivity of the thin film absorber compared to quartz. This is also expected to be true even if the partially absorbing film has a relatively high absorption coefficient in this wavelength range because of the expected thermal diffusivity advantage. It is possible that selecting other wavelengths in this region would improve the overall thermal uniformity by varying the relative thermal build up in the materials produced by direct absorption of the energy beam 2 from the energy source 1.

The type of photomask may also be considered when selecting a wavelength for overlay correction. For example, when using dark field masks, selecting a wavelength that is highly absorbed in the thin film may be preferred. The overlay modification may best be produced by modification of the thin film, because the majority of the surface is covered with thin film. When using clear field masks, selecting a wavelength that is highly absorbed by the substrate may be preferred. The overlay modification may best be produced by modification of the substrate surface, because the majority of the surface is not covered with thin film. In either case, producing a similar thermal modification in areas of the photomask that have thin film and areas of the photomask without thin film may be preferred so that the modification will be predictable across the mask surface.

The process just described for use according to certain aspects of the disclosure may increase the useable lifetime of a photomask 4 by correcting the overlay changes caused by use of the photomask in production and from cleaning processes. Exposure of the photomask during production use can degrade the thin film of the photomask. These changes in film composition can produce shifts in the overlay of the mask. Use of the present invention, to correct overlay changes caused by production use, may be advantageously implemented through a pellicle 8. This could allow the photomask 4 to be placed back into production instead of requiring a new photomask be fabricated to replace the degraded photomask. In addition, there are times where a photomask must be removed from production and cleaned for other reasons, which may include damage of the pellicle film and haze growth. Conventional cleaning process sequences may require the removal of an attached pellicle, cleaning, and then attachment of a new pellicle. The act of removing a pellicle from the mask can produce changes in the overlay of the photomask. In addition, wet clean processing may degrade the thin and can affect the overlay of the photomask. Use of the presently disclosed process can correct the positions of the features and effectively recover the feature positioning lost to the pellicle removal and wet clean. Adding another pellicle to the photomask after cleaning may also change the positions of the features in the thin film because of adding stress to the photomask. In this case, aspects of the presently disclosed process may be advantageously used through the pellicle 8 in the photomask assembly 102 to correct the overlay of the photomask 4.

An additional advantage of modifying the overlay of the photomask could be an improvement in mask-to-mask variability. The number of wet cleanings that each mask receives can vary and depends on several of the production parameters. Typically, a photomask may receive wet cleanings during the processes required to generate the pattern as well as wet cleanings following repair processes that correct imperfection in the pattern. The final overlay will depend on cumulative effects of the fabrication processes and the number of wet cleanings. This may result in mask-to-mask variation in overlay prior to use.

Mask-to-mask variability can be improved, according to aspects of the present disclosure. A different amount of overlay modification could be applied to different photomasks before use to adjust each mask to the same overlay level. By tightening the variation of this aspect of the photomask, it is possible that the allowable variation of other mask parameters can be increased. For example, it is possible that the allowable critical dimension variation during use can be increased if each photomask has a more precise overlay. This may be of particular advantage in combination with repair processing, since reduced dimensional control requirements may provide for a higher photomask yield.

Methods according to aspects of the present disclosure, may be applied to photomask thin film absorber modification and do not require removal of the pellicle 8 from the photomask assembly 102. Performing the thin film absorber modifications after pellicalization has the advantage of ensuring that no additional wet cleaning is required before using aspects of the presently disclosed process. For example, a laser-based overlay modification can be performed through the pellicle film material 8 without affecting the pellicle film characteristics (see FIG. 4). In this case, the absorption of the pellicle film at the process wavelength and the energy density (fluence) of the energy beam 2 at the surface of the pellicle film is typically considered. As with the substrate and substrate film, the material modification process generally does not produce a temperature increase in the pellicle film that is above the damage threshold. Depending on the pellicle film however, there may be significant absorption in the pellicle film near the 9 μm absorption peaks for the quartz substrate. However, it is still possible to operate in a region of significant pellicle film absorption because the pellicle film 8 is positioned above the substrate 4 surface.

Figure 5A:
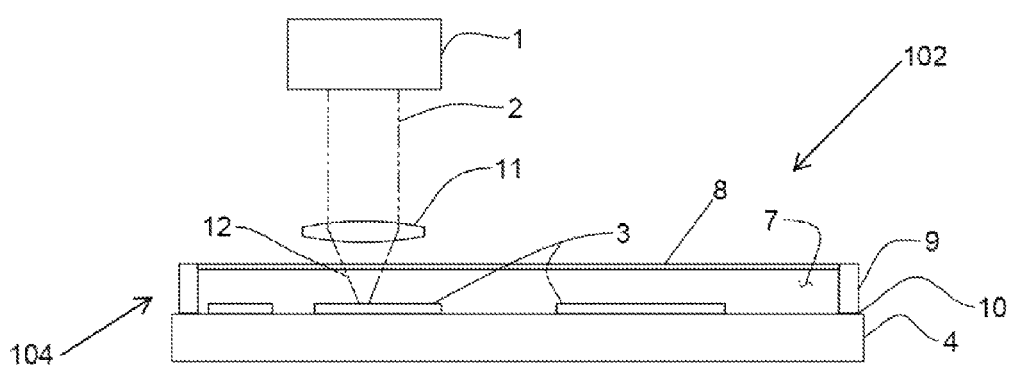
FIG. 5a illustrates a schematic diagram of a photomask with a pellicle showing a laser beam focused through the pellicle and onto the surface.

Focusing of the laser beam 12 through the pellicle film 8, for example with a lens 11, and onto the substrate 4 surface, in addition to wavelength selection, can reduce the relative temperature increase in the pellicle film 8 (see FIG. 5a). As stated in Equation 1, the temperature increase in a substance may be proportional to the fluence of an energy beam 2 applied to the surface;

$$\Delta T \sim F \quad (1)$$

where $\Delta T$ is the temperature change within the material and F is the absorbed laser fluence.

For a constant intensity or beam pulse energy, the fluence is inversely proportional to the square of the beam spot radius.

$$F \sim E/r2 \quad (2)$$

where F is the fluence, E is the energy and r is the radius of the beam on the substrate surface.

Figure 5B:
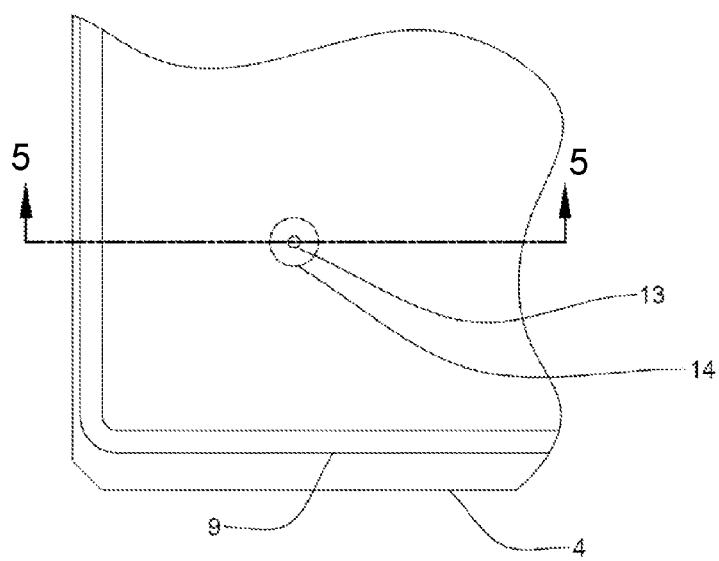
FIG. 5b illustrates a schematic diagram of the beam spot size on the pellicle versus on the mask produced by focusing.
Figure 5C:
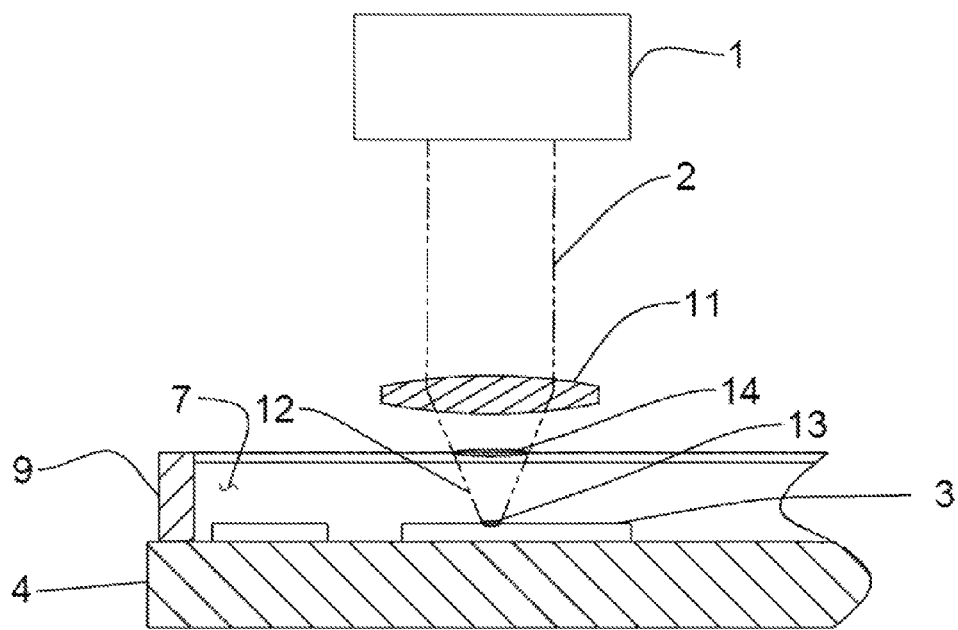
FIG. 5c illustrates a schematic diagram of a photomask with a pellicle showing laser beam focused through the pellicle and onto the surface and a side view of the beam spot on the pellicle.

The ratio of the beam radius 14 at the pellicle 8 to the beam radius 13 on the photomask 4 surface is typically increased by focusing the beam 2 through the pellicle 8 and, therefore, the relative fluence on the pellicle film compared to the photomask substrate surface can be reduced (FIG. 5b).

In addition to wavelength considerations, utilizing process parameters that produce a large temperature increase in the system (e.g., excessively long pulse length or high repetition rate) may be limited by the damage threshold of the pellicle film. The use of pulse-width, relative fluence, process duration, and external material cooling control are example off process parameters that can be used to minimize the temperature increase of the system.

In addition to the example of a MoSi-based partially absorbing photomasks, aspects of the disclosed process may also have a benefit to fully absorbing photomasks, optical photomasks without thin film absorber (quartz only), and next generation photomasks such as used for extreme ultraviolet (EUV) and nano-imprint lithography (NIL). Optical photomasks without thin film absorber have features that are etched directly into the base quartz substrate. Nano-imprint lithography masks also have features fabricated into the substrate and typically do not have a thin film. For both these types of masks, aspects of the disclosed process can be used to produce a thermal modification in the substrate that induces the desired modification of overlay. As for thin film optical photomasks, aspects of the disclosed process may be applied to EUV photomasks by modification of the absorber or the base substrate. In addition, it is conceivable, that thermal modification to the multi-layer can be used to modify the overlay. However, the thermal damage level of the reflective multi-layer must be considered, because changes to the multilayer may affect the performance of the photomask.

Pulse Shaping

The pulse width, temporal pulse shape and the spatial distribution of the laser may be used to enhance the material change process or increase the safe operation range for processing according to certain embodiments of the present invention. Shorter pulse widths can be used to minimize the overall thermal input to the system (substrate and environment). Longer pulse widths can be used to maintain the process temperature for an extended period of time enhancing the uniformity of the process and to prevent temperature differentials between different materials. The temporal pulse shape can be used to control the temperature rise within the thin film absorber. A long temperature rise can be used to produce an initial effect (e.g., annealing) that would be followed by a secondary effect (e.g., oxidation). The use of multiple pulses can also be used to lower the beam energy that is desirable for complete processing, thereby further decreasing the risk of substrate damage by analogy to utilizing longer pulse-widths. The advantage of multiple pulses being that it is possible that localized cooling of one material may prevent damage while allowing for the process to be performed. For example, the pellicle film could be cooled to prevent multiple pulse thermal build up while the thin film absorber is not cooled and the pulse-to-pulse thermal build up is used to reach process temperature in the film.

Figure 6A:
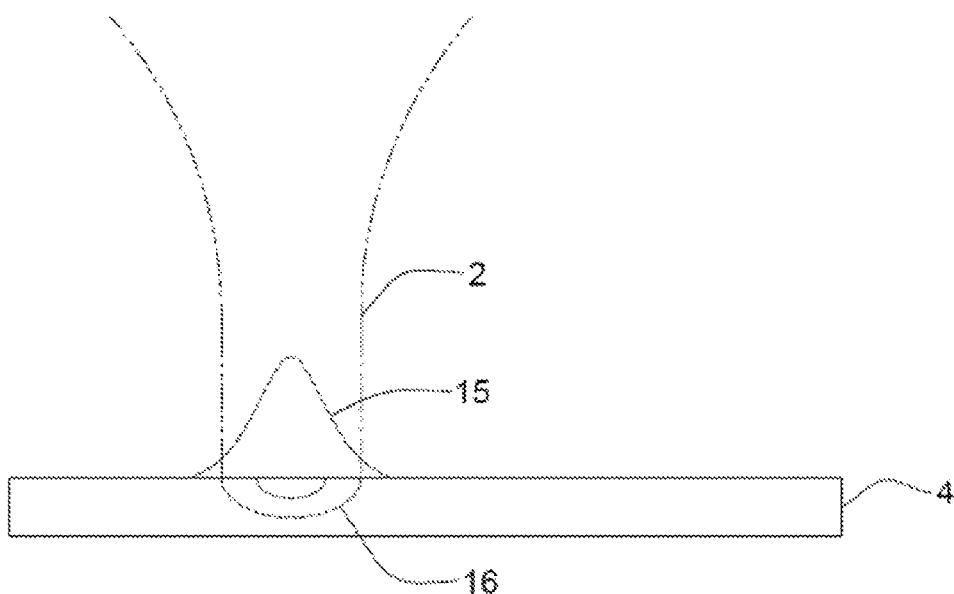
FIG. 6a illustrates a cross sectional view of a Gaussian beam energy distribution and the corresponding temperature profile produced.
Figure 6B:
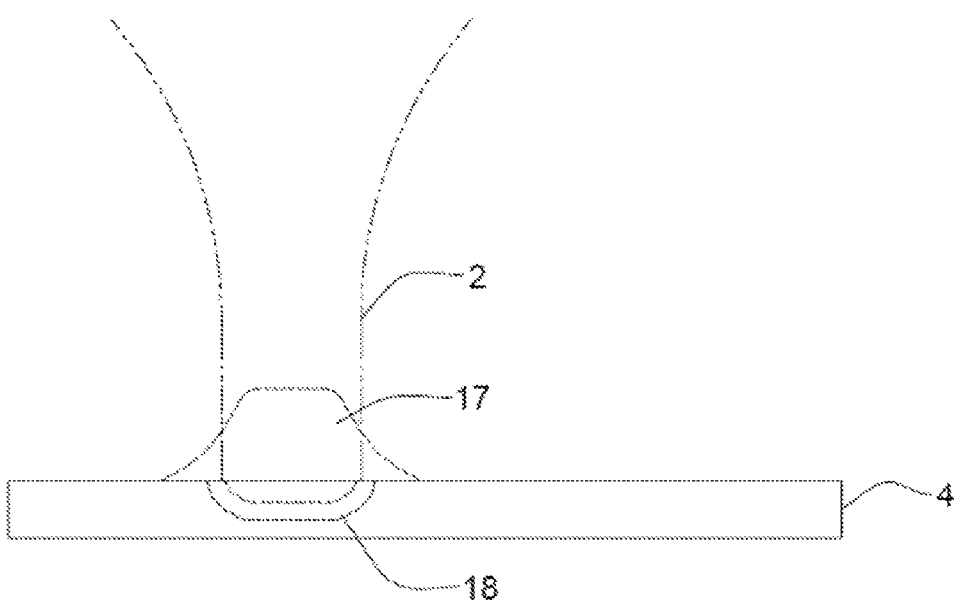
FIG. 6b illustrates a cross sectional view of a top-hat beam energy distribution and the corresponding temperature profile produced.

The spatial distribution of the laser beam can be used to increase the process window and process uniformity. For example, FIG. 6a shows a Gaussian spatial distribution 15, that may produce a temperature gradient 16 in the substrate 4 while FIG. 6b has a flat top or top hat spatial distribution 17 allowing for a more uniform temperature rise within the substrate 18. The spatial distribution can be used to increase the process window. Having a flat-top or top-hat spatial distribution allows for a uniform temperature rise within the beam spot, whereas a Gaussian distribution typically produces a temperature gradient within the beam spot. In order to avoid risk of substrate damage, the maximum energy in the beam is typically limited by the peak of a Gaussian distribution. A Gaussian energy distribution is expected to have a higher risk of exceeding the material damage level compared to a flat top beam if the energy variation is similar to the energy difference between the process and damage energy levels. Also, a Gaussian distribution may produce a non-uniform material change affect, whereas a top-hat energy distribution is expected to produce a more uniform material change within the working area of the beam.

Thermal Management

Because aspects of the present disclosure involve a thermally-based processes, it is sometimes desirable to manage the overall temperature of the system to avoid damage to thermally sensitive materials in proximity to the processed material. This is particularly true in the case of photomask material modification processing without pellicle removal. The pellicle films typically have a low thermal damage threshold. Therefore, it is sometimes useful to avoid an overall system temperature build up that may transfer to and/or damage the pellicle material. This includes the pellicle frame and the enclosed environment between the mask surface and the pellicle film.

Figure 7:
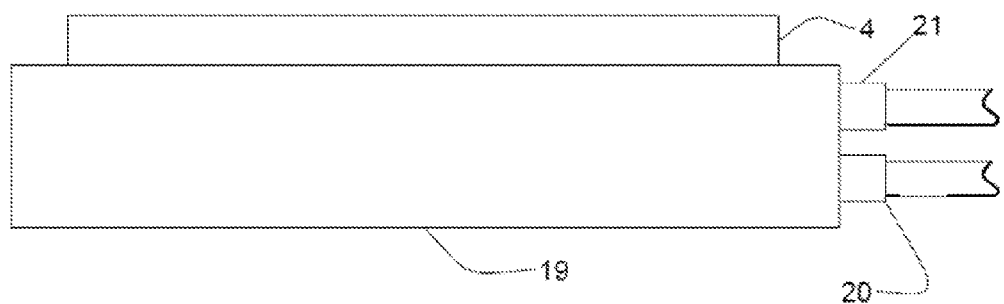
FIG. 7 illustrates a diagram of a photomask with a cold plate contacting the bottom of the mask.

Managing the system temperature can be accomplished in several ways. The following examples illustrate several representative methods of sample cooling and it is understood that other methods may exist. One way to manage the system temperature is through contact cooling. The photomask, for example, may be placed in contact with a plate 19 that acts as a heat sink to draw the heat generated on the front surface of the mask toward the back of the mask (see FIG. 7). This reduces the heat transfer to the environment above the mask surface, the pellicle film and the adhesive between the pellicle frame and the mask surface. The cooling can be accomplished in a variety of ways, including flowing a heat transfer fluid into inlet port 21 and out of outlet port 20 of the heat sink, by flowing other cooling fluids or gases over the mask and/or pellicle, thermoelectric cooling or laser induced cooling of a portion or the entirety of the mask and/or pellicle, or combinations thereof. The heat transfer fluid may be water, ethylene glycol, air, nitrogen, combinations thereof, or any other heat transfer fluid known in the art.

Figure 8:
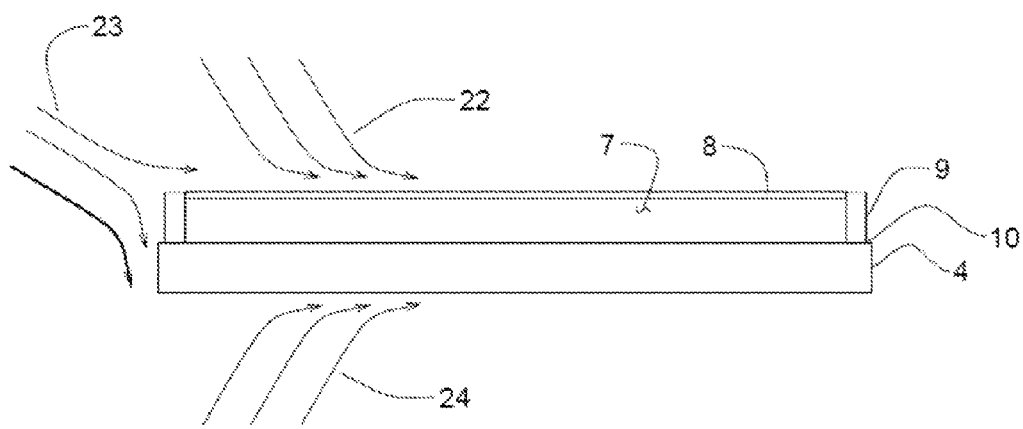
FIG. 8 illustrates a diagram showing forced convection cooling of areas on the photomask.

Another potential way to control temperature is through forced convection cooling. Filtered and/or cooled gas or liquid flow may be directed onto portions of the mask 24, onto the pellicle film 23, the pellicle frame and/or adhesives areas 22 to directly reduce the thermal energy or temperature build up in these materials (see FIG. 8). This may not only reduce the risk of pellicle film damage but also reduce the risk of creating contaminating out-gassing from the pellicle frame and pellicle film adhesives. In addition to hardware control of the system thermal buildup, it is possible to reduce thermal build up by allowing for an increased process time. Applying a slower rate of pulses to the system or allowing a delay between a series of pulse application can allow the injected heat to be removed without the total system temperature rising above a critical level.

Figure 9B:
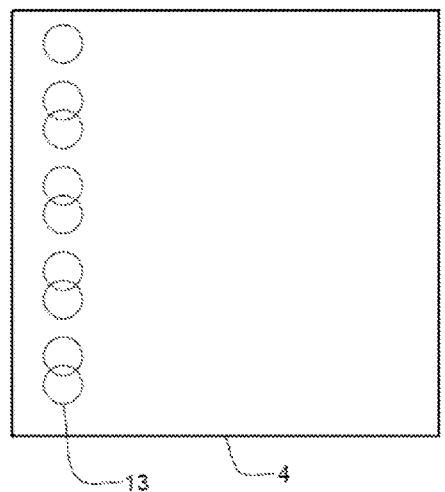
FIG. 9b illustrates a schematic diagram of two passes of the laser beam across surface to minimize local thermal energy or heat buildup. A single row with two sets of beam spots overlapped with large spacing between sets of pulses is illustrated.
Figure 9C:
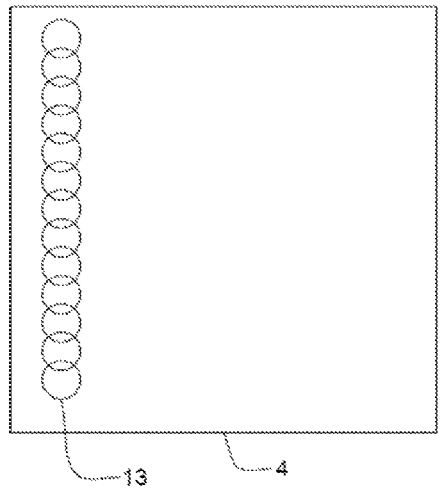
FIG. 9c illustrates a schematic diagram of multiple laser passes over an area of the substrate to achieve material change processing of the section of the substrate.
Figure 9D:
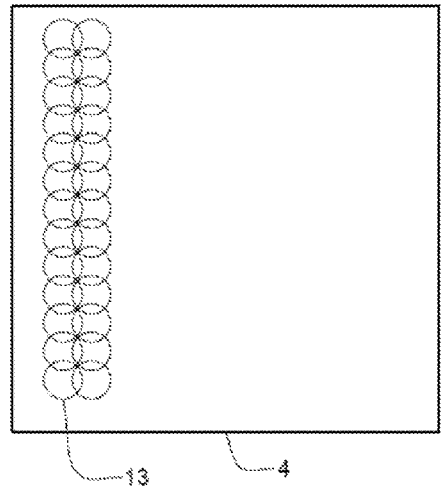
FIG. 9d illustrates a schematic diagram of a second dimension of material change processing.
Figure 9E:
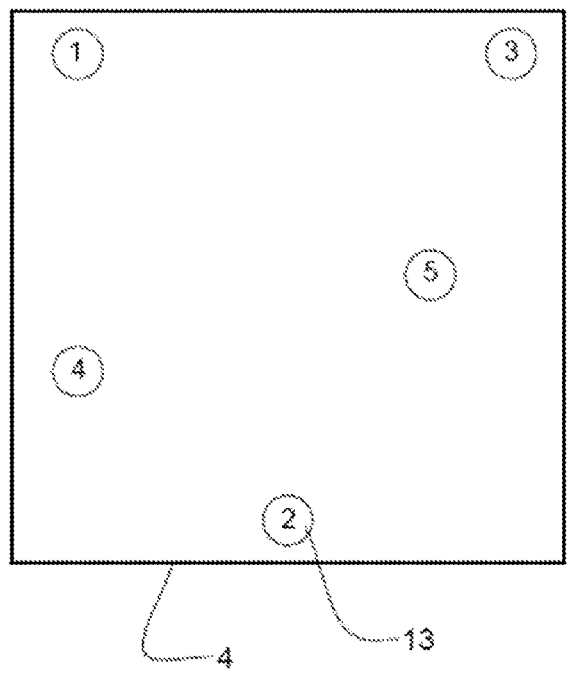
FIG. 9e illustrates a schematic diagram representing the use of non-contiguous pulses on the surface.

Pulse-to-pulse thermal energy or temperature build up may also advantageously be controlled and may depend on the thermal characteristics of the thin film absorber, substrate and/or adjacent materials. In general, pulse to pulse thermal build up can be controlled by reducing the number of laser pulses incident upon the surface per unit time. This temperature build up can also be controlled by increasing the distance between adjacent laser pulses. It may be particularly desirable to have a large lateral displacement between adjacent pulses, where the material is particularly sensitive to pulse-to-pulse thermal energy build up (e.g., pellicle film materials). In this case, the process typically involves positioning the laser beam 2 at nearly the same locations multiple times to obtain the desired material modification of the target surface. For example, a first series of laser pulses are exposed to the surface with a relatively large lateral separation (see FIG. 9a). A second pass over the same area places an additional series of laser pulses that are slightly shifted relative to the first set of spots (see FIG. 9b). This process continues until the entire area has been exposed to the laser pulses (see FIG. 9c). Overlap in a second direction can be used, according to aspects of the present disclosure, to completely expose a substrate 4 surface (see FIG. 9d). According to aspects of the present disclosure, this overall process is repeated and/or the overlap between passes is increased, particularly if it is desirable for the material modification process to include multiple pulses for process completion. Changing the position of the beam relative to the surface as illustrated can be accomplished by moving the beam and/or moving the substrate. In addition, applying pulses in a more systematically distributed manner across the mask may reduce further the likelihood of thermal energy or temperature buildup on the photomask 4 (see FIG. 9e).

Technology Combination

The current invention could be used in conjunction with surface preparation or environmental control techniques to extend reticle lifetime. Some of these techniques may require processing before pellicle mounting while others can be performed post-pellicalization. For example, a surface preparation method in conjunction with the present invention could provide for an increased material modification result. This process affect could then result from, for example, incorporating an alternative material into the thin film absorber or enhancing the thermal buildup in the thin film absorber.

Environmental control techniques can also be used in combination with the inventive method. Techniques that control the environment both inside and outside the pellicle and pre pellicle could be used in combination with the inventive material modification process. One embodiment would include exchanging the environment under the pellicle with a gas that will react with the thin film absorber material to change the material properties. This could be performed without pellicle removal by gas exchange through a filtered vent on the pellicle frame. It may be additionally advantageous to maintain an inert environment inside or outside of the pellicle in conjunction with the present invention to enhance bulk absorber properties relative to surface material change processes. These combination processes could increase the relative overlay change or the direction of the feature shift, for example.

Metrology

Figure 10:
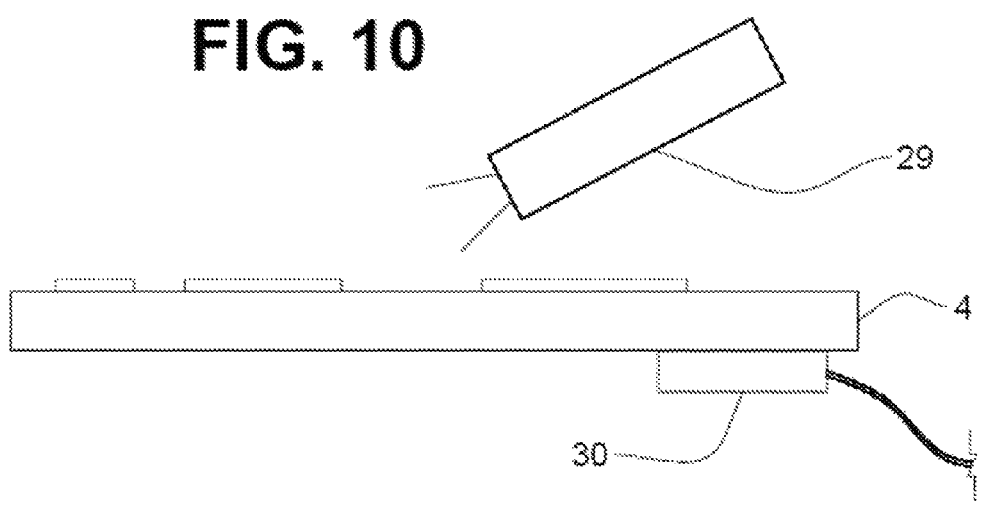
FIG. 10 illustrates a schematic diagram of a partial absorber material on a substrate with a thermocouple or an infrared temperature monitoring devices.

Methods according to aspects of the disclosure may also be used in combination with metrology to monitor the critical process parameters and/or to evaluate the progression or completion of the material modification process. Measurement of the locally generated temperature of the substrate materials can, for example, be used in combination with material change. Temperature measurement can be evaluated prior to application of the process in order to verify risk of temperature related damage. In addition, these temperatures may be monitored during the material modification process to verify process control and/or reduce the risk of material damage. For example, according to certain embodiments of the present invention, the temperature of the substrate and/or absorber film is monitored during the process and has the ability to feed back control of the energy applied to maintain the desired process or turn off the process if too large a temperature build up is detected. Multiple devices and methods of temperature monitoring exist and include contact 30 (e.g., thermocouples) and non-contact 29 (e.g., infrared cameras) devices and methods (see FIG. 10).

Figure 11:
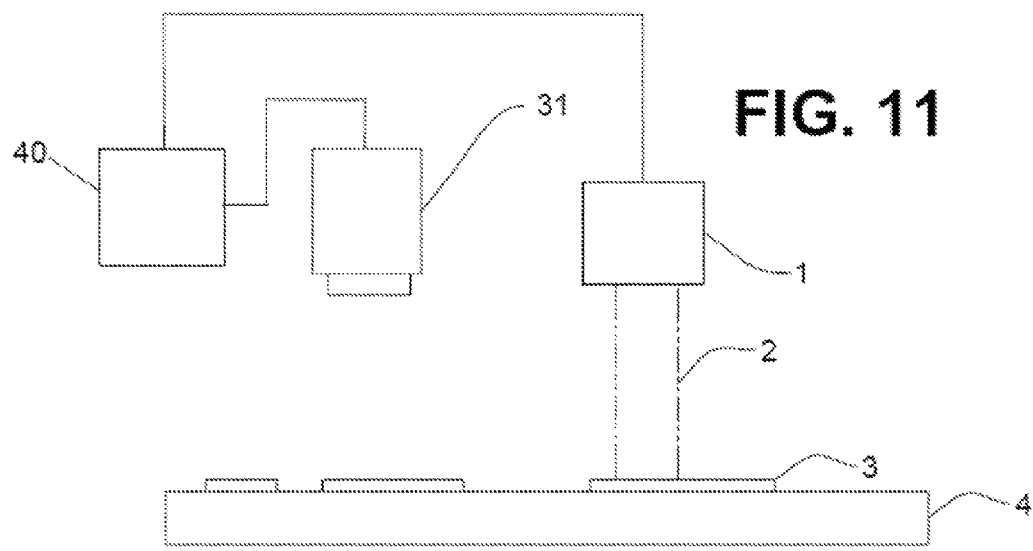
FIG. 11 illustrates a schematic diagram of a partial absorber material on a substrate with imaging, microscopy, spectroscopy, or combination system for material property analysis.
Figure 12:
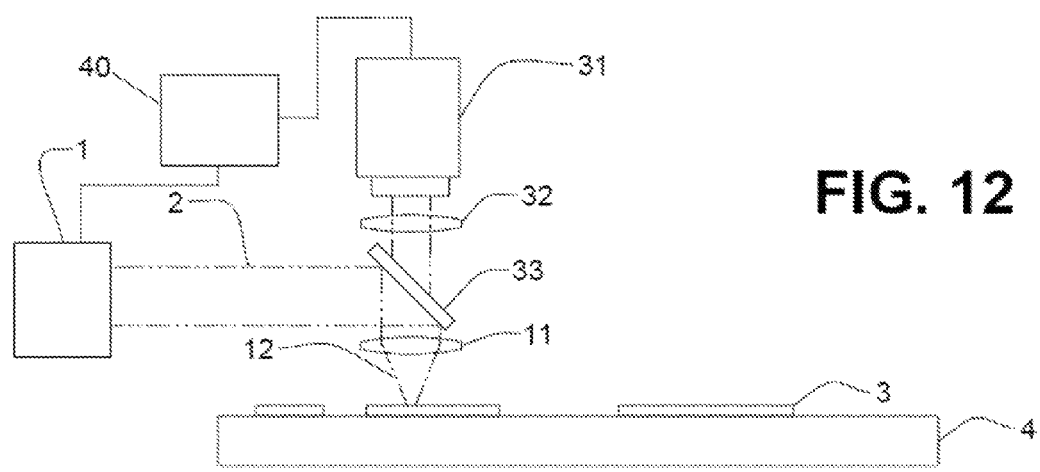
FIG. 12 illustrates a schematic diagram of a partial absorber material on a substrate with a measurement system where the measurement system and laser beam delivery share a common path.

Metrology devices 31 and methods can also be used, according to aspects of the present disclosure, to analyze or monitor the material or performance properties of the substrate and/or materials on or adjacent to the substrate prior to, during and/or after the energy beam 2 is applied to the substrate 4 (FIG. 11). For example, measurement of the positions of features on the photomask can be used to calculate the overlay error before processing. This could be used to determine the level of material modification required to correct the local or global overlay errors. This could also be used to determine the correct energy or number of pulses to apply to discreet areas of the photomask to induce the desired change. This metrology could also be used to monitor the overlay during processing and feedback information to the process or stop the processes if the adjustments are within a pre-defined process limit. In addition, the material properties of the pellicle film could be monitored to determine if an adverse effect is occurring to the pellicle material. This information could be used before processing to limit process temperature, or during processing to stop the process if damage is observed. For example, one or more ellipsometers could be used to measure the material response of the pellicle film, absorber film and substrate surface. This data can then be used to calculate the desired material properties including film thickness, transmission and phase. It is possible that the measurement devices could share a common optical path with the process energy source (FIG. 12). For example, the energy source 1 may be coupled into the measurement device 31 path using a beam splitting device 33. Additional optical elements 2) may also be beneficial to properly collect the metrology data, as illustrated in FIG. 12.

In the case of a photomask, for example, multiple metrologies may be incorporated into the material modification process according to certain embodiments of the present invention. Identifying the overlay errors of the entire photomask reticle, for example, may define the processing temperature requirement. Identifying the local or global overlay variations on a photomask may be used to determine the lateral dimensions for process application and multiple energy levels required for processing different locations/sections across the photomask. In addition, it may be beneficial to apply a lower energy process initially, to measure the response of the photomask features to the process. Once the magnitude of the response for a specific mask is measured, additional processing that utilizes this information can then be applied. This allows the per mask response to be taken into account, when determining the best process to correct the overlay of a photomask.

Metrology is also used according to certain aspects of the present disclosure to monitor the characteristics of materials adjacent to the surface being cleaned. For example, the temperature of a pellicle film above a photomask may be monitored to reduce the risk of pellicle film damage. The transmission characteristics of the pellicle film can also be used to qualify the effects of the process during or after the processing.

As will be appreciated by one of skill in the art upon practicing one or more aspects of the present disclosure, the metrology examples discussed above are not intended to be all inclusive of the present invention. Rather, these examples merely illustrate the use of metrology within some methods according to the present disclosure.

The metrology device 31, the external energy source 1, or combinations thereof, maybe operatively coupled to a controller 40 for control thereof. The controller 40 may be any purpose-built processor for effecting actuation or control of the metrology device 31, the external energy source, or both. It will be appreciated that the controller 40 may be embodied in a single housing, or a plurality of housings distributed throughout the excitation and metrology apparatus. Further, the module controller 310 may include power electronics, preprogrammed logic circuits, data processing circuits, volatile memory, non-volatile memory, software, firmware, input/output processing circuits, combinations thereof, or any other controller structures known in the art.

It will be appreciated that the controller 40 may be configured to effect or control any methods or functions described herein. Further, it will be appreciated that an article of manufacture comprising non-transient machine-readable instructions encoded thereon may be configured to cause the controller 40 to effect or control any of the methods or functions described herein when the instructions are executed by the controller 40.

Apparatus

Figure 13:
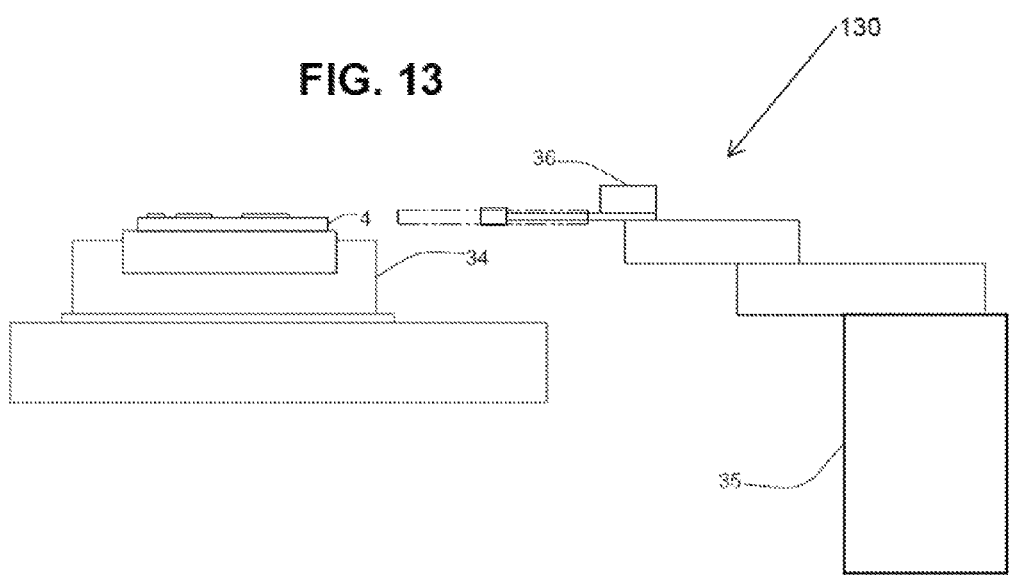
FIG. 13 illustrates a system diagram for a robotic loading and X/Y/Z stage motion of a substrate relative to a laser beam.

Certain methods for material modification according to aspects of the present disclosure may be practiced using various aspects of apparatus described herein. An example of such a substrate manipulation apparatus 130 additionally includes robotic handling 35 of the substrate 4 material and/or movement of the substrate 4 along one or more axes of motion using a translation stage 34 to position the substrate 4 sample relative to an external energy source 1, as shown in FIG. 13. Robotic handling may include a substrate-gripping end-effector 36 for transferring the substrate 4 between positions. The apparatus 130 may, for example, contain one or more of the metrologies as described above and/or may include ways of controlling the temperature of the substrate and/or adjacent materials during the material modification process. In addition, the apparatus may include metrology used to register the substrate to the staging system and therefore to the laser beam 2. This metrology may also include computer-controlled vision recognition systems. Further, the apparatus may also utilize computer control of the laser, motion and/or metrology and may provide for software based recipe control of the material modification process. Laser energy source control may, for example, include controlling when laser pulses are applied as well as the amount of energy applied during the process.

Reticle Fabrication Process

A method and/or apparatus according to aspects of the present disclosure can be used as part of a novel reticle fabrication process that includes the modification of the overlay on a photomask surface. According to aspects of the present disclosure, the material modification process can be used to adjust the overlay during or following photomask fabrication processes, including photomask repair processing. The photomask may or may not be pellicalized prior to processing. Certain embodiments may also be applied to the photomask following a cleaning process. According to aspects of the present disclosure, material modification may be used to correct for overlay changes resulting from a wet cleaning process. As a result, the process may be used to modify overlay to bring the photomask into a desired specification so that it can be used in production. Other aspects of the present disclosure can be used after the reticle has been used in production to correct overlay changes caused by production use. The process may be applied through pellicle to correct overlay, thereby avoiding re-pellicle clean processes. In this embodiment, aspects of the disclosed process may extend the lifetime of a photomask beyond what is currently achievable by avoiding additional wet cleaning processes and/or re-pellicalization(s). Duplicate sets of photomasks are conventionally required because the out-of-specification photomasks must be discarded. Therefore, the disclosed methods may also provide for cost reduction by extending the useful life of a photomask and reducing the requirement for duplicate masks in order to complete a production run.

A novel photomask reticle fabrication method according to certain aspects of the present disclosure incorporates an apparatus utilizing one or more of the methods discussed above to modify the thin film absorber 3 properties of the photomask 4. A typical reticle fabrication process according to an aspect of the present disclosure includes multiple wet cleaning processes applied to a photomask during fabrication. The number of wet cleaning processes varies from mask to mask so that there is a final overlay variation between masks. An aspect of the present disclosure utilizes one or more of the material modification methods described above to globally change the overlay of each photomask different amounts so that the final overlay variation between masks is reduced. According to another aspect of the present disclosure, a reticle fabrication process incorporating the use of one or more of the disclosed methods can be used to reduce overlay error (globally or locally) to extend the useful life of the photomask 4.

In addition to mask-to-mask optical performance variability, each wet cleaning process may add variability to the material properties across a single photomask surface. It is possible that the variability of the overlay on a single photomask will be out of acceptable limits after fabrication and/or wet cleaning processing. This is particularly true as the number of wet cleaning processes is increased. According to an aspect of the present disclosure, a novel photomask reticle fabrication process is provided that incorporates an apparatus utilizing one or more of the material modification methods described above to improve the uniformity of the overlay of the photomask. This may include producing non-uniform changes across the entire photomask or one or more local changes in the overlay. According to certain embodiments of the current invention, non-uniform material changes are used to extend the useful life of the photomask by correcting non-uniformity in the overlay of the photomask.

According to certain embodiments of the present invention, a novel reticle wafer fabrication process reduces the use of additional masks or mask sets for product manufacture, by extending the photomask lifetime.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Unless specified otherwise, use of the word "substantially" herein shall mean "considerable in extent," or "largely but not necessarily wholly that which is specified."

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

We claim:

1. A wafer fabrication process including a method for improving optical characteristics of a photomask, comprising:

performing a first wafer print process using the photomask and a pellicle disposed across the photomask;

directing electromagnetic radiation through the pellicle toward the photomask, the photomask having a partially-absorbing thin film disposed thereon, the electromagnetic radiation having a wavelength that substantially coincides with a high absorption coefficient of the photomask;

generating a thermal energy increase in the photomask in response to the electromagnetic radiation incident thereon; and modifying a position of a first feature on the photomask relative to a second feature on the photomask.

2. The method of claim 1, wherein said modifying includes increasing a distance between the first feature and the second feature.

3. The method of claim 1, wherein said modifying includes decreasing a distance between the first feature and the second feature.

4. The method of claim 1, wherein the electromagnetic radiation is further directed toward the thin film, and the electromagnetic radiation has a wavelength that substantially coincides with a high absorption coefficient of the thin film.

5. The method of claim 1, further comprising performing a second wafer print process using the photomask, the second wafer print process occurring after the optical characteristics of the photomask has been improved by the modification of the position of the first feature on the photomask relative to the second feature on the photomask.

6. The method of claim 1, wherein the photomask is a next generation photomask configured for use in extreme ultra-violet (EUV) lithography.

7. The method of claim 1, wherein the thin film disposed on the photomask is patterned and includes void areas under which respective portions of the photomask are exposed.

8. A wafer fabrication process including a method for improving optical characteristics of at least one photomask, comprising:

directing electromagnetic radiation toward the at least one photomask, the electromagnetic radiation having a wavelength that substantially coincides with a high absorption coefficient of the at least one photomask;

generating a thermal energy increase in the at least one photomask in response to the electromagnetic radiation incident thereon;

modifying a position of a first feature on the at least one photomask relative to a second feature on the at least one photomask; and performing a wafer print process using the at least one photomask after the optical characteristics of the at least one photomask has been improved by the modification of the position of the first feature on the at least one photomask relative to the second feature on the at least one photomask.

9. The method of claim 8, wherein said modifying includes increasing a distance between the first feature and the second feature.

10. The method of claim 8, wherein said modifying includes decreasing a distance between the first feature and the second feature.

11. The method of claim 8, wherein a thin film is disposed on the at least one photomask.

12. The method of claim 11, wherein the thin film disposed on the at least one photomask is patterned and includes void areas under which respective portions of the at least one photomask are exposed.

13. The method of claim 8, wherein the at least one photomask is at least partially enclosed within a pellicle, the method further comprising directing the electromagnetic radiation through a pellicle film positioned above the at least one photomask.

14. The method of claim 8, wherein the at least one photomask is a next generation photomask configured for use in extreme ultra-violet (EUV) lithography.

15. The method of claim 8, wherein the at least one photomask is a next generation photomask configured for use in nano-imprint lithography.

* * * * *